United States Patent
Yu et al.

(10) Patent No.: US 12,278,214 B2
(45) Date of Patent: Apr. 15, 2025

(54) INTEGRATED CIRCUIT PACKAGE AND METHOD

(71) Applicant: Taiwan Semiconductor Manufacturing Company, Ltd., Hsinchu (TW)

(72) Inventors: Chen-Hua Yu, Hsinchu (TW); Chuei-Tang Wang, Taichung (TW); Chieh-Yen Chen, Taipei (TW); Wei Ling Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 444 days.

(21) Appl. No.: 17/873,442

(22) Filed: Jul. 26, 2022

(65) Prior Publication Data

US 2022/0359467 A1    Nov. 10, 2022

Related U.S. Application Data

(62) Division of application No. 16/684,913, filed on Nov. 15, 2019, now Pat. No. 11,621,244.

(51) Int. Cl.
*H01L 25/065* (2023.01)
*H01L 21/48* (2006.01)
(Continued)

(52) U.S. Cl.
CPC ...... *H01L 25/0655* (2013.01); *H01L 21/4857* (2013.01); *H01L 23/481* (2013.01);
(Continued)

(58) Field of Classification Search
CPC . H01L 25/0652; H01L 25/0655; H01L 25/50; H01L 21/4857; H01L 23/481;
(Continued)

(56) References Cited

U.S. PATENT DOCUMENTS

| | | | |
|---|---|---|---|
| 6,239,366 B1 | 5/2001 | Hsuan et al. | |
| 7,315,454 B2 | 1/2008 | Schuster | |
| 8,993,380 B2 | 3/2015 | Hou et al. | |
| 9,281,254 B2 | 3/2016 | Yu et al. | |

(Continued)

FOREIGN PATENT DOCUMENTS

| | | |
|---|---|---|
| CN | 103383923 A | 11/2013 |
| CN | 105580135 A | 5/2016 |

(Continued)

*Primary Examiner* — Dale E Page
*Assistant Examiner* — Quovaunda Jefferson
(74) *Attorney, Agent, or Firm* — Slater Matsil, LLP

(57) ABSTRACT

In an embodiment, a device includes: a first die array including first integrated circuit dies, orientations of the first integrated circuit dies alternating along rows and columns of the first die array; a first dielectric layer surrounding the first integrated circuit dies, surfaces of the first dielectric layer and the first integrated circuit dies being planar; a second die array including second integrated circuit dies on the first dielectric layer and the first integrated circuit dies, orientations of the second integrated circuit dies alternating along rows and columns of the second die array, front sides of the second integrated circuit dies being bonded to front sides of the first integrated circuit dies by metal-to-metal bonds and by dielectric-to-dielectric bonds; and a second dielectric layer surrounding the second integrated circuit dies, surfaces of the second dielectric layer and the second integrated circuit dies being planar.

20 Claims, 23 Drawing Sheets

(51) Int. Cl.
*H01L 23/00* (2006.01)
*H01L 23/48* (2006.01)
*H01L 25/00* (2006.01)

(52) U.S. Cl.
CPC .............. *H01L 24/08* (2013.01); *H01L 24/80* (2013.01); *H01L 25/50* (2013.01); *H01L 2224/08225* (2013.01); *H01L 2224/80895* (2013.01); *H01L 2224/80896* (2013.01)

(58) Field of Classification Search
CPC ............ H01L 23/145; H01L 23/49816; H01L 23/5385; H01L 23/50; H01L 23/525; H01L 23/528; H01L 23/5386; H01L 24/08; H01L 24/19; H01L 24/20; H01L 24/80; H01L 2224/08225; H01L 2224/80895; H01L 2224/80896; H01L 2224/03845; H01L 2224/03921; H01L 2224/05555; H01L 2224/0557; H01L 2224/06152; H01L 2224/06154; H01L 2224/06181; H01L 2224/08145; H01L 2224/08146; H01L 2224/091; H01L 2224/09181; H01L 2224/12105; H01L 2224/73251; H01L 2224/80006; H01L 2224/80357; H01L 2224/80908; H01L 2224/96; H01L 2225/06524; H01L 2225/0654; H01L 2224/80001; H01L 2224/08; H01L 2224/19
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 11,621,244 | B2 * | 4/2023 | Yu .................... H01L 24/20 257/734 |
| 2010/0289131 | A1 | 11/2010 | Bathan et al. |
| 2011/0165731 | A1 | 7/2011 | Gerber et al. |
| 2013/0234322 | A1 | 9/2013 | Pendse |
| 2015/0091179 | A1 | 4/2015 | Shenoy et al. |
| 2016/0037643 | A1 | 2/2016 | Kim et al. |
| 2016/0071829 | A1 | 3/2016 | Yu et al. |
| 2016/0172332 | A1 | 6/2016 | Haba et al. |
| 2018/0005992 | A1 | 1/2018 | Yu et al. |
| 2018/0053746 | A1 | 2/2018 | Yu et al. |
| 2018/0138151 | A1 | 5/2018 | Shih et al. |
| 2018/0366436 | A1 | 12/2018 | Wang et al. |

FOREIGN PATENT DOCUMENTS

| | | |
|---|---|---|
| CN | 106033751 A | 10/2016 |
| CN | 107768351 A | 3/2018 |
| CN | 108074828 A | 5/2018 |
| JP | 2000196008 A | 7/2000 |
| JP | 2000223651 A | 8/2000 |
| WO | 9919911 A1 | 4/1999 |

* cited by examiner

INTEGRATED CIRCUIT PACKAGE AND METHOD

PRIORITY CLAIM AND CROSS-REFERENCE

This application is a divisional of U.S. patent application Ser. No. 16/684,913, filed on Nov. 15, 2019, entitled "Integrated Circuit Package and Method," which application is hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging. Some applications call for greater parallel processing capabilities of integrated circuit dies. Packaging technologies may be used to integrate multiple dies, allowing a greater degree of parallel processing capabilities.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
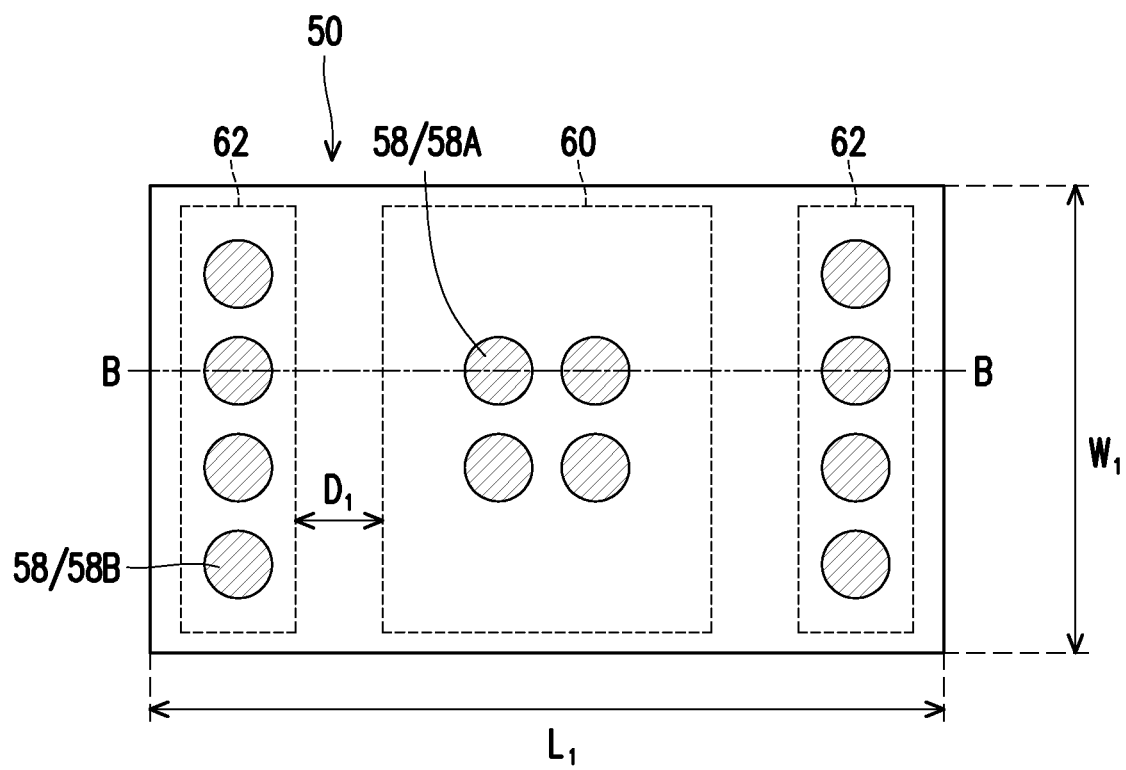
FIGS. 1A and 1B illustrate an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit package, such as a system-on-integrated-chip (SoIC) device, is formed by stacking die arrays. Each of the die arrays is laid out in a checkerboard pattern, where orientations of the dies alternate along the rows and columns of the respective die array. The die arrays are stacked such that orientations of the stacked dies alternate vertically along the stack. Each die thus overlies and may be electrically connected to three underlying dies. Arranging the die arrays in the SoIC device with checkerboard die orientation patterns allows a three-dimensional die network to be built that has logic and memory dies disposed among each other.

Figure 1B:
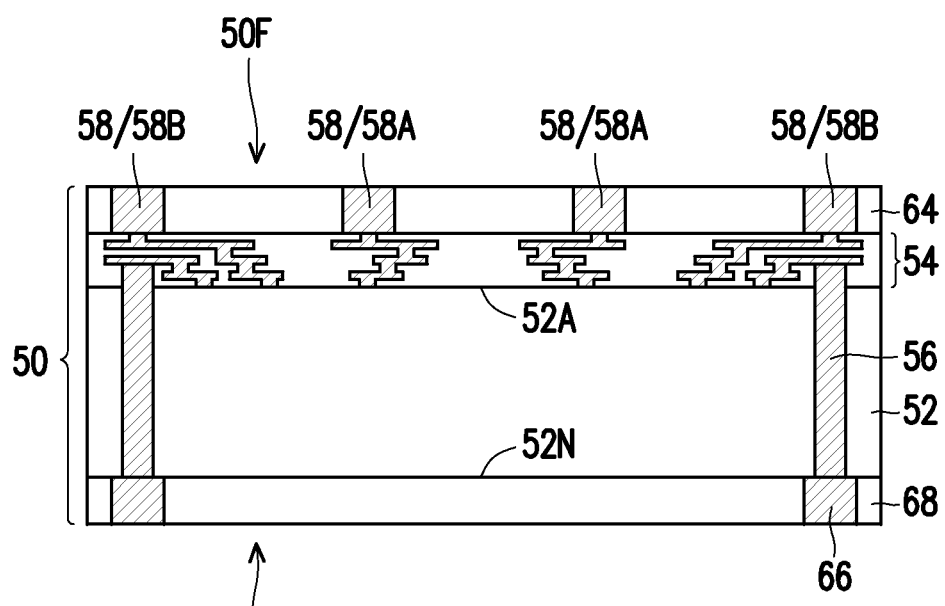

FIGS. 1A and 1B illustrate an integrated circuit die 50, in accordance with some embodiments. FIG. 1A is a top-down view of the integrated circuit die 50. FIG. 1B is a cross-sectional view of the integrated circuit die 50, and is shown along reference cross-section B-B in FIG. 1A. Multiple integrated circuit dies 50 will be packaged in subsequent processing to form an integrated circuit package, such as a system-on-integrated-chip (SoIC) device. Each integrated circuit die 50 may be a process or logic die (e.g., central processing unit (CPU), graphics processing unit (GPU), system-on-a-chip (SoC), application processor (AP), digital signal processing die (DSP), field programmable gate array die (FPGA), microcontroller, artificial intelligence (AI) accelerator, in-memory computing (IMC) die, etc.), a volatile or non-volatile memory die (e.g., dynamic random access memory (DRAM) die, static random access memory (SRAM) die, resistive random-access memory (RRAM) die, magnetoresistive random-access memory (MRAM) die, phase-change random-access memory (PCRAM) die, etc.).

The integrated circuit die 50 is a small die, such as a dielet, and may have a small surface area, For example, the integrated circuit die 50 can have a center region 60 with a surface area in the range of about 25 mm$^2$ to about 49 mm$^2$, which allows more integrated circuit dies 50 to be packaged in an integrated circuit package. Further, the integrated circuit die 50 has a rectangular shape, e.g., has a length $L_1$ and a width $W_1$, with the length $L_1$ being greater than the width $W_1$. The length $L_1$ is measured along the longitudinal axis of the integrated circuit die 50, and the width $W_1$ is measured along the latitudinal axis of the integrated circuit die 50. The length $L_1$ and width $W_1$ are each small. For example, the length $L_1$ can be in the range of about 5.5 mm to about 8 mm, the width $W_1$ can be in the range of about 5 mm to about 7 mm, and the ratio of $L_1:W_1$ can be in the range of about 1:0.875 to about 1:0.9.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface 52A and an inactive surface 52N.

Devices may be formed at the active surface 52A of the semiconductor substrate 52. The devices may be active devices (e.g., transistors, diodes, etc.), capacitors, resistors, etc. The inactive surface 52N may be free from devices. An inter-layer dielectric (ILD) is over the active surface 52A of the semiconductor substrate 52. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

An interconnect structure 54 is over the active surface 52A of the semiconductor substrate 52. The interconnect structure 54 interconnects the devices at the active surface 52A of the semiconductor substrate 52 to form an integrated circuit. The interconnect structure 54 may be formed by, for example, metallization patterns in dielectric layers. The metallization patterns include metal lines and vias formed in one or more dielectric layers. The metallization patterns of the interconnect structure 54 are electrically connected to the devices at the active surface 52A of the semiconductor substrate 52.

The integrated circuit die 50 further includes through vias 56, which are formed extending between the active surface 52A and the inactive surface 52N of the semiconductor substrate 52. The through vias 56 are also sometimes referred to as through-substrate vias or through-silicon vias (TSVs) when the semiconductor substrate 52 is a silicon substrate. The through vias 56 are physically and electrically connected to the metallization patterns of the interconnect structure 54.

In the embodiment shown, the through vias 56 are formed in a "via middle" process, where some layers of the interconnect structure 54 are initially formed on the semiconductor substrate 52, and the through vias 56 are then formed extending through the semiconductor substrate 52 and the initial layers of the interconnect structure 54. The remaining layers of the interconnect structure 54 are then formed on the through vias 56 and the initial layers of the interconnect structure 54. In other embodiments, the through vias 56 are formed in a "via last" process, where the interconnect structure 54 is initially formed on the semiconductor substrate 52. The through vias 56 are then formed extending through the semiconductor substrate 52 and the interconnect structure 54. In yet other embodiments, the through vias 56 are formed in a "via first" process, where the through vias 56 are initially formed extending through the semiconductor substrate 52. The interconnect structure 54 is then formed on the through vias 56 and the semiconductor substrate 52.

As an example to form the through vias 56, recesses can be formed in the semiconductor substrate 52 (and optionally, some or all layers of the interconnect structure 54) by, for example, etching, milling, laser techniques, a combination thereof, and/or the like. A thin dielectric material may be formed in the recesses, such as by using an oxidation technique. A thin barrier layer may be conformally deposited over the front side 50F of the integrated circuit die 50 and in the openings, such as by CVD, ALD, PVD, thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side 50F of the integrated circuit die 50 by, for example, a chemical-mechanical polish (CMP). Remaining portions of the barrier layer and conductive material form the through vias 56.

The integrated circuit die 50 further includes die connectors 58, such as conductive pillars or pads, to which external connections are made. The die connectors 58 are in and/or on the interconnect structure 54, and can be formed of a metal, such as copper, aluminum, or the like. The die connectors 58 may be formed by, for example, plating, or the like. The die connectors 58 and the through vias 56 may be electrically connected by the metallization patterns of the interconnect structure 54, or may be electrically connected to the respective integrated circuits of the integrated circuit die 50, respectively, by the metallization patterns of the interconnect structure 54.

A first subset of the die connectors 58A are electrically connected to the integrated circuits of the integrated circuit die 50, and a second subset of the die connectors 58B are also electrically connected to integrated circuits of the integrated circuit die 50. The die connectors 58A are disposed in a center region 60 of the front side 50F of the integrated circuit die 50, and the die connectors 58B are disposed at end regions 62 of the front side 50F of the integrated circuit die 50. The die connectors 58A and 58B may have different sizes and may have different pitches. For example, the die connectors 58A may each have a small size, such as a width in the range of about 0.1 µm to about 10 µm, and the die connectors 58B may each have a large size, such as a width in the range of about 0.1 µm to about 10 µm. Likewise, the die connectors 58A may each have a small pitch, such as a pitch in the range of about 0.2 µm to about 20 µm, and the die connectors 58B may each have a large pitch, such as a pitch in the range of about 0.2 µm to about 20 µm. A small size and pitch allows more connections to be formed to the integrated circuit dies 50. The end regions 62 are at the ends of the integrated circuit die 50 along the longitudinal axis of the integrated circuit die 50. The center region 60 is disposed between the end regions 62, and is disposed a distance Di from each of the end regions 62. The distance Di can be small, such as in the range of about 100 µm to about 500 µm. No die connectors 58 are disposed in regions between the center region 60 and the end regions 62. As will be discussed in greater detail below, dies having the configuration of die connectors 58A in the center region 60 and die connectors 58B in the end regions 62 are configured to be subsequently attached to three overlapping dies: a first die overlapping the center region 60 and a second and third die overlapping each of the end regions 62.

Optionally, solder regions (e.g., solder balls or solder bumps) may be disposed on the die connectors 58. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 64 is on the active side of the integrated circuit die 50, such as on the interconnect structure 54. The dielectric layer 64 laterally encapsulates the die connectors 58, and the dielectric layer 64 is laterally coterminous with sidewalls of the integrated circuit die 50. Initially, the dielectric layer 64 may bury the die connectors 58, such that the topmost surface of the dielectric layer 64 is above the topmost surfaces of the die connectors 58. In some embodiments where solder regions are disposed on the die connectors 58, the dielectric layer 64 may also bury the solder regions. Alternatively, the solder regions may be removed prior to forming the dielectric layer 64. The dielectric layer 64 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 64 may be formed, for example, by spin coating, lamination, chemical vapor deposition (CVD), or the like.

The die connectors 58 are exposed through the dielectric layer 64 during formation of the integrated circuit die 50. Exposing the die connectors 58 may remove any solder regions that may be present on the die connectors 58. For example, the die connectors 58 and dielectric layer 64 can be planarized using, e.g., a CMP process, an etch back process, the like, or combinations thereof. After planarization, surfaces of the die connectors 58 and dielectric layer 64 are planar and are exposed at the front side 50F of the integrated circuit die 50. As discussed further below, the planarized front sides 50F of multiple integrated circuit dies 50 will be directly bonded in a face-to-face manner to form an integrated circuit package.

Die connectors 66 and a dielectric layer 68 are formed at the inactive surface 52N of the semiconductor substrate 52. The die connectors 66 may be formed of a similar material and by a similar method as the die connectors 58. The die connectors 66 are physically connected to the through vias 56, and are electrically connected to integrated circuits of the integrated circuit die 50 by the through vias 56. The dielectric layer 68 are may be formed of a similar material and by a similar method as the dielectric layer 64. Before forming the die connectors 66 and dielectric layer 68, the inactive surface 52N of the semiconductor substrate 52 can be ground to expose the through vias 56. After formation, the die connectors 66 and dielectric layer 68 can be planarized using, e.g., a CMP process, an etch back process, the like, or combinations thereof. After planarization, surfaces of the die connectors 66 and dielectric layer 68 are planar and are exposed at the back side 50B of the integrated circuit die 50. As discussed further below, the planarized back sides 50B of multiple integrated circuit dies 50 will be directly bonded in a back-to-back manner to form an integrated circuit package.

FIGS. 2A through 6C illustrate various views of intermediate steps during a process for forming an integrated circuit package 100, in accordance with some embodiments. FIGS. 2A, 3A, 4A, 5A, and 6A are top-down views of the integrated circuit package 100. FIGS. 2B, 3B, 4B, 5B, and 6B are cross-sectional views of the integrated circuit package 100 along reference cross-section X-X of the corresponding "A" figures. FIGS. 2C, 3C, 4C, 5C, and 6C are cross-sectional views of the integrated circuit package 100 along reference cross-section Y-Y of the corresponding "A" figures.

One package region is illustrated in FIGS. 2A through 6C, in which the integrated circuit package 100 is formed. During or after formation, a singulation process is performed by sawing along scribe line regions, e.g., around the illustrated package region, to singulate the integrated circuit package 100 from adjacent package regions. It should be appreciated that multiple package regions can be formed, and an integrated circuit package 100 can be formed in each of the package regions.

Figure 2A:
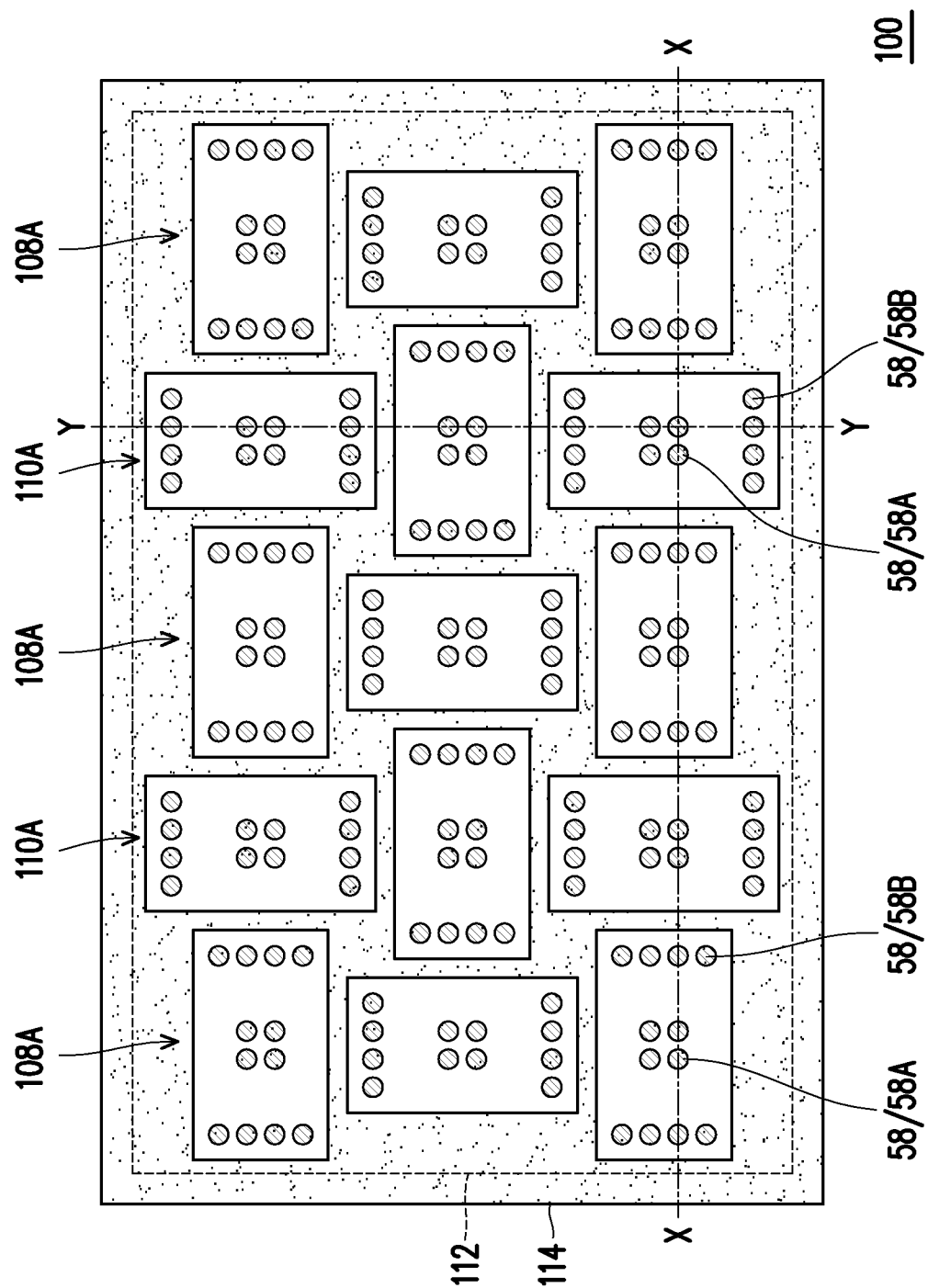
FIGS. 2A through 6C illustrate various views of intermediate steps during a process for forming an integrated circuit package, in accordance with some embodiments.
Figure 2B:
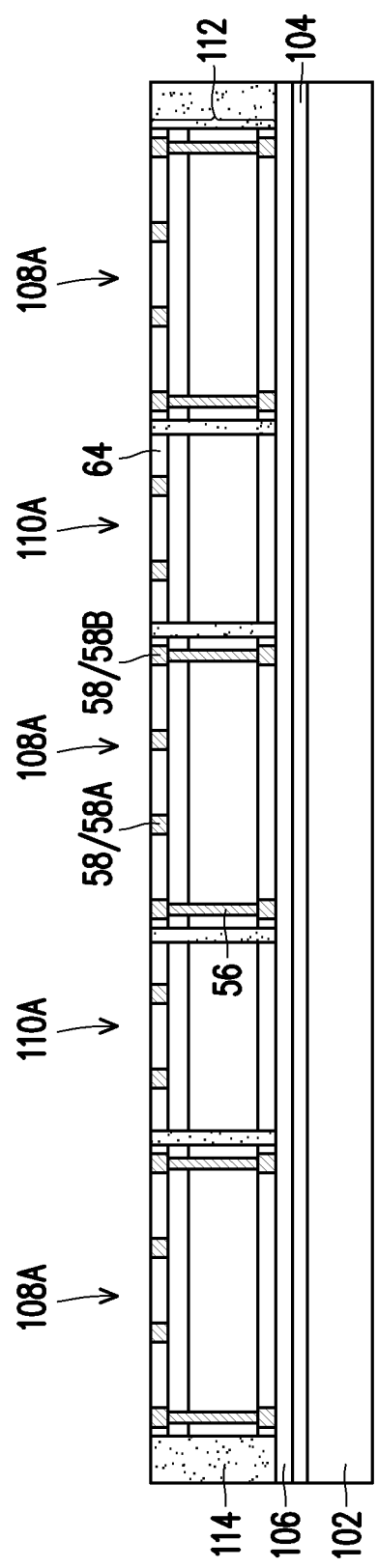
Figure 2C:
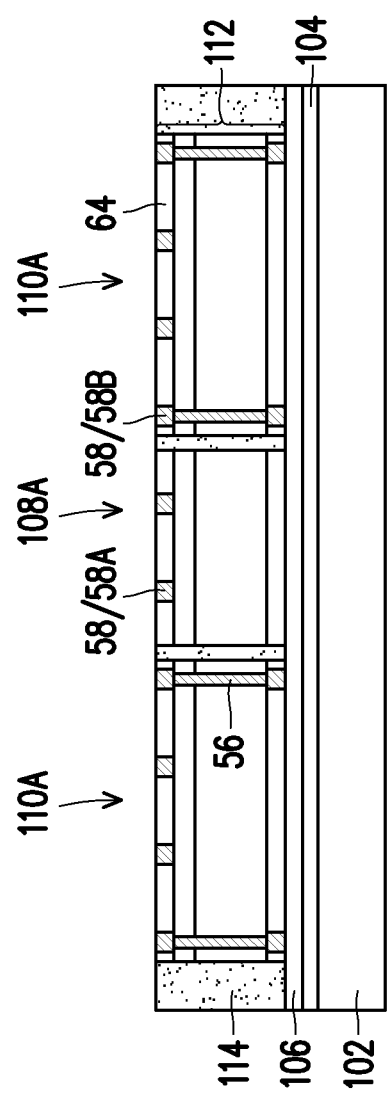

In FIGS. 2A, 2B, and 2C, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

A bonding layer 106 is then formed on the release layer 104. The bonding layer 106 is formed of a dielectric material. For example, the bonding layer 106 may be a polymer such as PBO, polyimide, BCB, or the like; a nitride such as silicon nitride or the like; an oxide such as silicon oxide, PSG, BSG, BPSG, or the like; the like, or a combination thereof. The bonding layer 106 may be formed, for example, by spin coating, lamination, chemical vapor deposition (CVD), or the like.

Memory dies 108A and logic dies 110A are then bonded to the bonding layer 106. The memory dies 108A and logic dies 110A have similar features as the integrated circuit die 50, and similar reference numerals are used to illustrate similar features. In some embodiments, the logic dies 110A are IMC dies, which have compute acceleration functions and are designed based on SRAM, RRAM, MRAM, or PCRAM memories. For example, the IMC dies can include SRAM, RRAM, MRAM, or PCRAM memories that are configured to perform parallel arithmetic calculations. The memory dies 108A and logic dies 110A are placed on the bonding layer 106, and then pressed into the bonding layer 106, e.g., as part of a thermocompression bonding process.

The memory dies 108A and logic dies 110A are placed face-up in a die array 112. The memory dies 108A and logic dies 110A are placed in a checkerboard die orientation pattern in the top-down view of the die array 112. In other words, orientations of the memory dies 108A and logic dies 110A alternate along the rows and columns of the die array 112, where the longitudinal axes of the logic dies 110A are parallel and extend in a first direction, and the longitudinal axes of the memory dies 108A are parallel and extend in a second direction, with the first and second directions being perpendicular, and the first and second directions each being parallel to a major surface of the dielectric layer 106. Further, the memory dies 108A and logic dies 110A are alternatingly disposed along the rows and columns of the die array 112.

A dielectric layer 114 is then formed surrounding the memory dies 108A and logic dies 110A. The dielectric layer 114 fills gaps between respective ones of the memory dies 108A and logic dies 110A, thus protecting the dies. The dielectric layer 114 may be an oxide such as silicon oxide, PSG, BSG, BPSG, or the like; a nitride such as silicon nitride or the like; a polymer such as PBO, polyimide, BCB, or the like; an encapsulant such as a molding compound, epoxy, or the like; the like, or a combination thereof. In some embodiments, the dielectric layer 114 is an oxide such as silicon oxide. A planarization process may be performed on the dielectric layer 114 to expose the die connectors 58 of the memory dies 108A and logic dies 110A. The planarization process may also be performed on the dielectric layers 64. Top surfaces of the die connectors 58, dielectric layers 64, and dielectric layer 114 are planar after the planarization process. The planarization process may be, for example, a CMP process, a grinding process, an etch back process, the like, or combinations thereof.

Figure 3A:
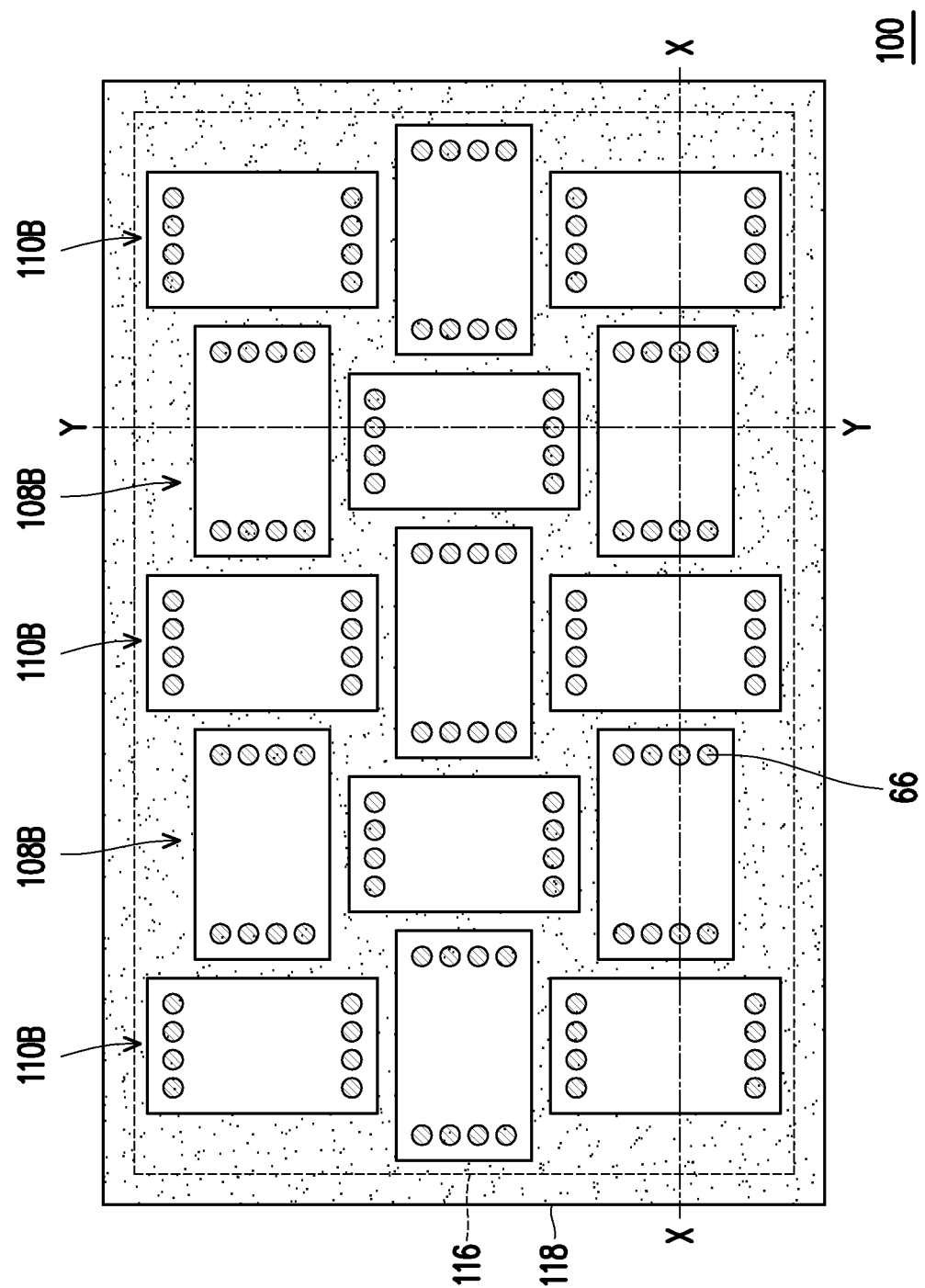
Figure 3B:
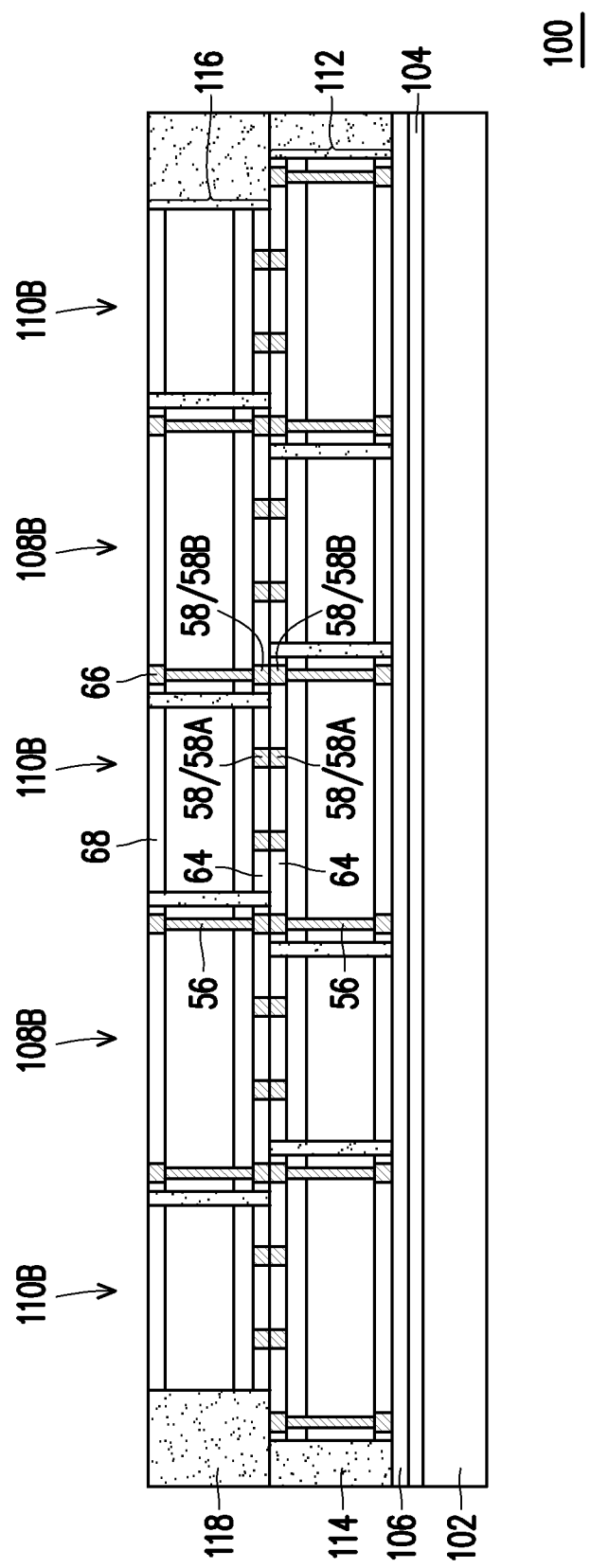
Figure 3C:
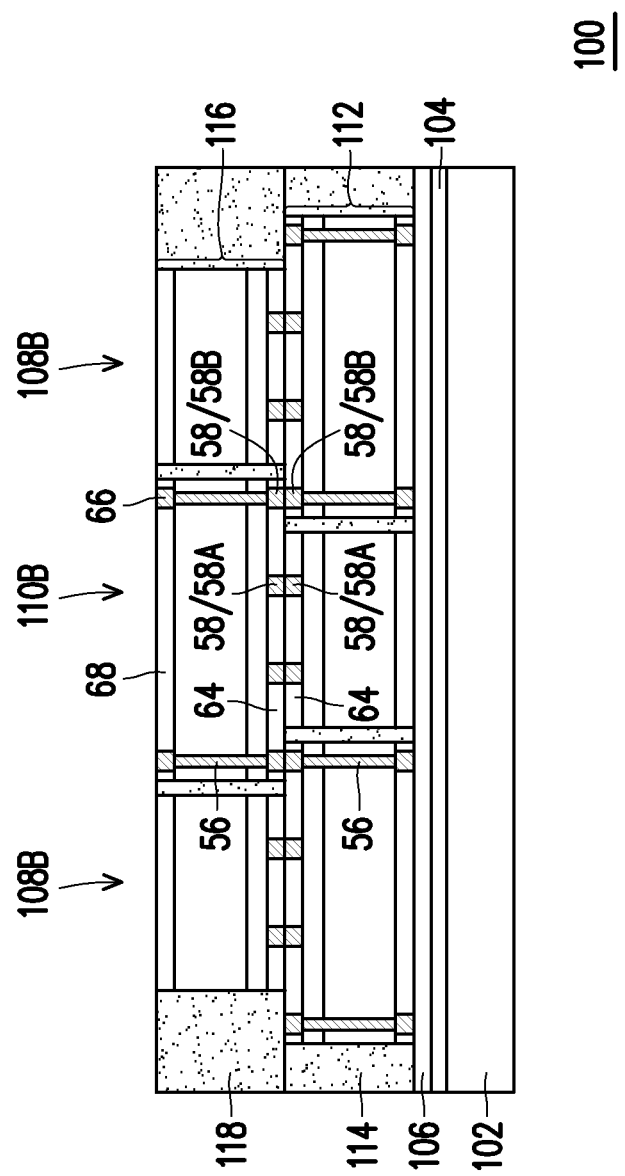

In FIGS. 3A, 3B, and 3C, memory dies 108B and logic dies 110B are bonded to the memory dies 108A and logic dies 110A. The memory dies 108B and logic dies 110B have similar features as the integrated circuit die 50, and similar reference numerals are used to illustrate similar features. The dies are directly bonded in a face-to-face manner by hybrid bonding, where the dielectric layer 64 of one die is bonded to the dielectric layer 64 of another die through dielectric-to-dielectric bonding, and where the die connectors 58 of one die are bonded to the die connectors 58 of another die through metal-to-metal bonding, without using any eutectic material (e.g., solder).

The bonding may include a pre-bonding and an annealing. During the pre-bonding, a small pressing force is applied to press the logic dies 110A and 110B and the memory dies 108A and 108B against each other. The pre-bonding is performed at a low temperature, and after the pre-bonding, the dielectric layers 64 are bonded to each other. The bonding strength is then improved in a subsequent annealing step, in which the dielectric layers 64 are annealed at a high temperature. After the annealing, direct bonds, such as fusions bonds, are formed bonding the dielectric layers 64 of the dies. The die connectors 58 are physically and electrically connected to each other with a one-to-one correspondence. The die connectors 58 may be in physical contact after the pre-bonding, or may expand to be brought into physical contact during the annealing. Further, during the annealing, the material of the die connectors 58 (e.g., copper) intermingles, so that metal-to-metal bonds are also formed. Hence, the resulting bonds between the memory dies 108A and 108B and the logic dies 110A and 110B are hybrid bonds that include both dielectric-to-dielectric bonds and metal-to-metal bonds.

As an example of the bonding, the dielectric layers 64 may be formed of silicon oxide, and the die connectors 58 may be formed of copper. The surfaces of the dies may be treated with a plasma, such as an $N_2$ plasma, to form dangling bonds on the surfaces of the dielectric layers 64. A wet clean process can then be performed to terminate the dangling bonds with OH groups. The wet clean process may be performed with, e.g., diluted ammonia and deionized water. Pre-bonding may then be performed with a low pressing force at room temperature. Annealing may then be performed at a high temperature, such as a temperature of less than about 400° C. As the temperature increases, OH bonds between the dielectric layers 64 break to form stronger Si—O—Si bonds, and hence the dielectric layers 64 are directly bonded to each other through dielectric-to-dielectric bonds. Further, as the temperature increases, diffusion occurs between the die connectors 58, and hence the die connectors 58 are directly bonded to each other through metal-to-metal bonds.

The memory dies 108B and logic dies 110B are placed face-down in a die array 116, on the die array 112. The memory dies 108B and logic dies 110B are placed in a checkerboard die orientation pattern in the top-down view of the die array 116. In other words, orientations of the memory dies 108B and logic dies 110B alternate along the rows and columns of the die array 116, where the longitudinal axes of the memory dies 108B are parallel and extend in a first direction, and the longitudinal axes of the logic dies 110B are parallel and extend in a second direction, with the first and second directions being perpendicular, and the first and second directions each being parallel to a major surface of the dielectric layer 106. The longitudinal axes of the memory dies 108B are parallel to the longitudinal axes of the memory dies 108A (see FIG. 2A), and the longitudinal axes of the logic dies 110B are parallel to the longitudinal axes of the logic dies 110A (see FIG. 2A). Further, the memory dies 108B and logic dies 110B are alternatingly disposed along the rows and columns of the die array 116.

The memory dies 108B are centered over the logic dies 110A, and the die connectors 58A of each memory die 108B are bonded to the die connectors 58A of a corresponding logic die 110A, such that bonded pairs of the memory dies 108B and logic dies 110A are electrically connected to one another. Likewise, the logic dies 110B are centered over the memory dies 108A, and the die connectors 58A of each logic die 110B are bonded to the die connectors 58A of a corresponding memory die 108A, such that bonded pairs of the memory dies 108A and logic dies 110B are electrically connected to one another. Each bonded die pair forms a computing site, with each memory die acting as a local, high-bandwidth, low-latency cache for its corresponding logic die. The die connectors 58B of each memory die 108B are bonded to the die connectors 58B of adjacent memory dies 108A (see FIG. 3B), such that the memory dies 108A and 108B are electrically connected to one another. Each memory die 108B partially overlaps and is bonded to one underlying logic die 110A and two underlying memory dies 108A. Likewise, the die connectors 58B of each logic die 110B are bonded to the die connectors 58B of adjacent logic dies 110A (see FIG. 3C), such that the logic dies 110A and 110B are electrically connected to one another. Each logic die 110B partially overlaps and is bonded to one underlying memory die 108A and two underlying logic dies 110A.

A dielectric layer 118 is then formed surrounding the memory dies 108B and logic dies 110B. The dielectric layer 118 can be formed after placement of the memory dies 108B and logic dies 110B but before annealing to complete the hybrid bonding, or can be formed after annealing. The dielectric layer 118 fills gaps between respective ones of the memory dies 108B and logic dies 110B, thus protecting the dies. The dielectric layer 118 may be an oxide such as silicon oxide, PSG, BSG, BPSG, or the like; a nitride such as silicon nitride or the like; a polymer such as PBO, polyimide, BCB, or the like; an encapsulant such as a molding compound, epoxy, or the like; the like, or a combination thereof. In some embodiments, the dielectric layer 118 is an oxide such as silicon oxide. A planarization process may be performed on the dielectric layer 118 to expose the die connectors 66 of the memory dies 108B and logic dies 110B. The planarization process may also be performed on the dielectric layers 68. Top surfaces of the die connectors 66, dielectric layers 68, and dielectric layer 118 are planar after the planarization process. The planarization process may be, for example, a CMP process, a grinding process, an etch back process, the like, or combinations thereof.

Because the memory dies 108B and logic dies 110B do not concentrically overlap the memory dies 108A and logic dies 110A, some portions of the dielectric layers 114 and 118 can participate in the hybrid bonding. For example, the memory dies 108B and logic dies 110B can also be bonded to portions of the dielectric layer 114. Likewise, the memory dies 108A and logic dies 110A can also be bonded to portions of the dielectric layer 118.

After the memory dies 108B and logic dies 110B are bonded to the memory dies 108A and logic dies 110A, circuit probe (CP) testing is performed to ascertain whether the memory dies 108A and 108B and the logic dies 110A and 110B are known good dies (KGDs). The integrated circuit dies are tested by use of a probe. The probe is physically and electrically connected to the die connectors 66 by, e.g., test connectors. The CP testing can also be used to ascertain whether the memory dies 108B and logic dies 110B have been fully bonded to the memory dies 108A and logic dies 110A. The hybrid bonds may be reworked (e.g., by performing additional annealing) if the intermediate structure fails the CP testing. The testing may include testing of the functionality of the various integrated circuit dies, or may include testing for known open or short circuits that may be expected based on the design of the integrated circuit dies. After testing is complete, the probe is removed and any excess reflowable material on the die connectors 66 may be removed by, e.g., an etching process, a chemical-mechanical polish (CMP), a grinding process, or the like.

Figure 4A:
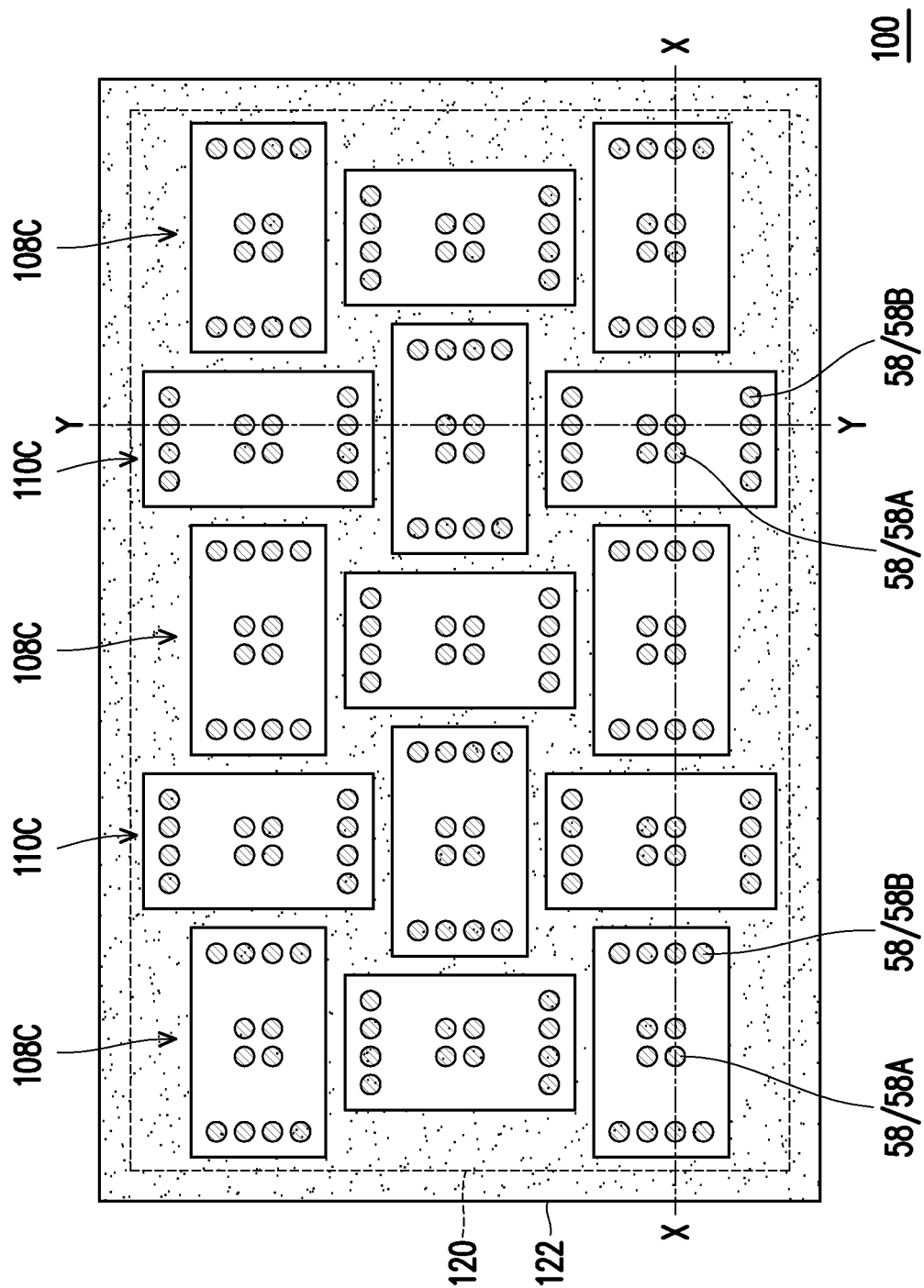
Figure 4B:
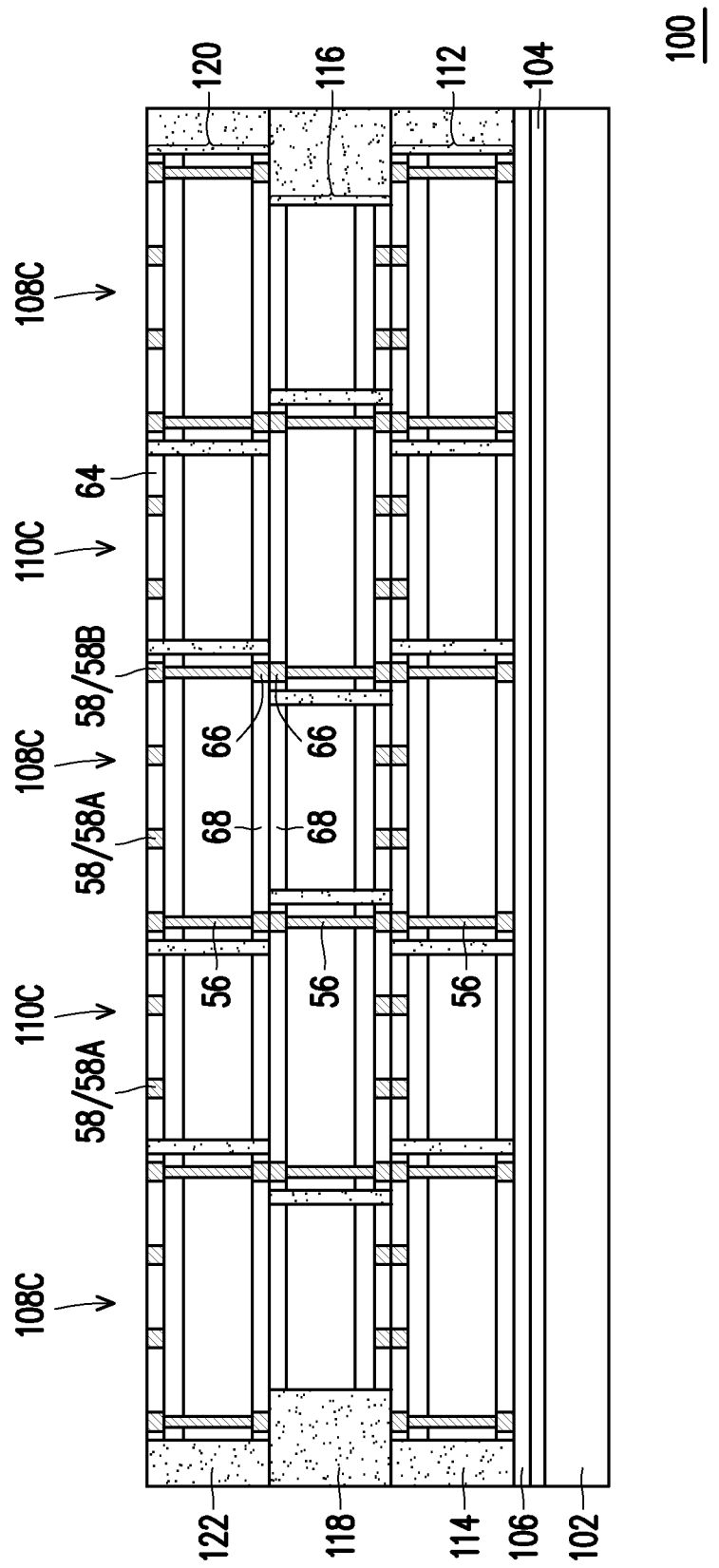
Figure 4C:
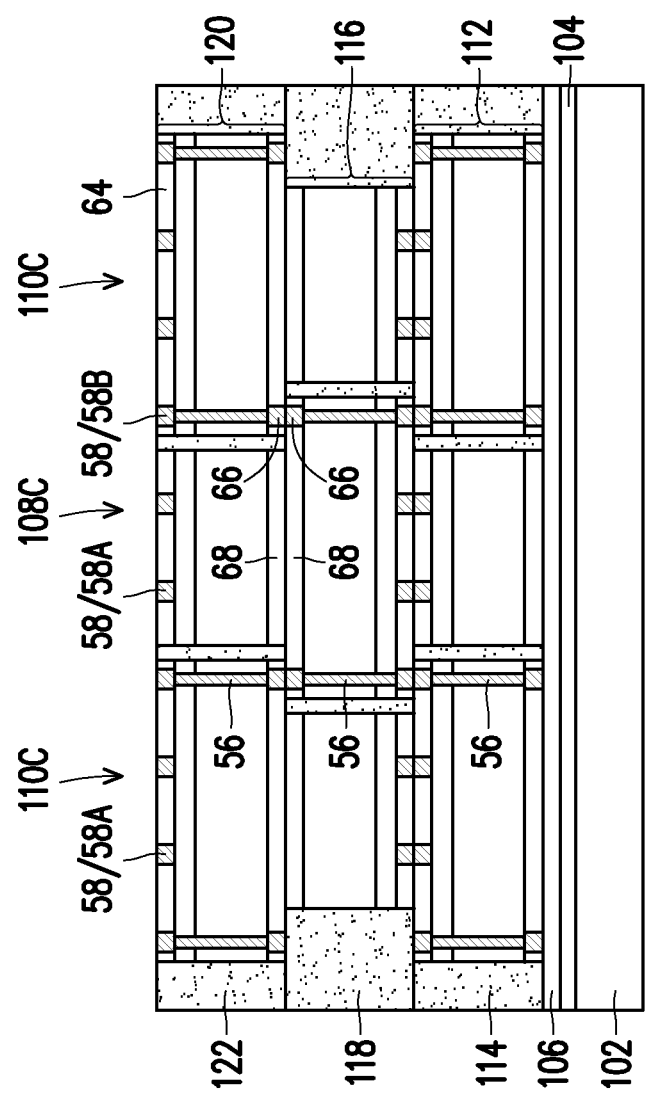

In FIGS. 4A, 4B, and 4C, memory dies 108C and logic dies 110C are bonded to the memory dies 108B and logic dies 110B (see FIG. 3A). The memory dies 108C and logic dies 110C have similar features as the integrated circuit die 50, and similar reference numerals are used to illustrate similar features. The dies are directly bonded in a back-to-back manner by hybrid bonding, where the dielectric layer 68 of one die is bonded to the dielectric layer 68 of another die through dielectric-to-dielectric bonding, and where the die connectors 66 of one die are bonded to the die connectors 66 of another die through metal-to-metal bonding, without using any eutectic material (e.g., solder). The hybrid bonding may be performed using a similar method as that described above with respect to FIGS. 3A, 3B, and 3C.

The memory dies 108C and logic dies 110C are placed face-up in a die array 120, on the die array 116. The memory dies 108C and logic dies 110C are placed in a checkerboard die orientation pattern in the top-down view of the die array 120. In other words, orientations of the memory dies 108C and logic dies 110C alternate along the rows and columns of the die array 120, where the longitudinal axes of the memory dies 108C are parallel and extend in a first direction, and the longitudinal axes of the logic dies 110C are parallel and extend in a second direction, with the first and second directions being perpendicular, and the first and second directions each being parallel to a major surface of the dielectric layer 106. The longitudinal axes of the memory dies 108C are parallel to the longitudinal axes of the memory dies 108A and 108B (see FIGS. 2A and 3A), and the longitudinal axes of the logic dies 110C are parallel to the longitudinal axes of the logic dies 110A and 110B (see FIGS. 2A and 3A). Further, the memory dies 108C and logic dies 110C are alternatingly disposed along the rows and columns of the die array 120.

The memory dies 108C are centered over the logic dies 110B, and the logic dies 110C are centered over the memory dies 108B. The die connectors 66 of each memory die 108C are bonded to the die connectors 66 of adjacent memory dies 108B (see FIG. 4B), such that the memory dies 108B and 108C are electrically connected to one another. The memory dies 108A and 108C are thus electrically connected to one another by the through vias 56 of the memory dies 108B. Each memory die 108C partially overlaps and is bonded to one underlying logic die 110B and two underlying memory dies 108B. Because they are arranged back-to-back, the die connectors 66 of the memory dies 108C are not directly connected to the die connectors 66 of the logic dies 110B. Likewise, the die connectors 66 of each logic die 110C are bonded to the die connectors 66 of adjacent logic dies 110B (see FIG. 4C), such that the logic dies 110B and 110C are electrically connected to one another. The logic dies 110A and 110C are thus electrically connected to one another by the through vias 56 of the logic dies 110B. Each logic die 110C partially overlaps and is bonded to one underlying memory die 108B and two underlying logic dies 110B. Because they are arranged back-to-back, the die connectors 66 of the logic dies 110C are not directly connected to the die connectors 66 of the memory dies 108B.

A dielectric layer 122 is then formed surrounding the memory dies 108C and logic dies 110C. The dielectric layer 122 fills gaps between respective ones of the memory dies 108C and logic dies 110C, thus protecting the dies. The dielectric layer 122 may be an oxide such as silicon oxide, PSG, BSG, BPSG, or the like; a nitride such as silicon nitride or the like; a polymer such as PBO, polyimide, BCB, or the like; an encapsulant such as a molding compound, epoxy, or the like; the like, or a combination thereof. In some embodiments, the dielectric layer 122 is an oxide such as silicon oxide. A planarization process may be performed on the dielectric layer 122 to expose the die connectors 58 of the memory dies 108C and logic dies 110C. The planarization process may also be performed on the dielectric layers 64. Top surfaces of the die connectors 58, dielectric layers 64, and dielectric layer 122 are planar after the planarization process. The planarization process may be, for example, a CMP process, a grinding process, an etch back process, the like, or combinations thereof.

Because the memory dies 108C and logic dies 110C do not concentrically overlap the memory dies 108B and logic dies 110B, some portions of the dielectric layers 118 and 122 can participate in the hybrid bonding. For example, the memory dies 108C and logic dies 110C can also be bonded to portions of the dielectric layer 118. Likewise, the memory dies 108B and logic dies 110B can also be bonded to portions of the dielectric layer 122.

Figure 5A:
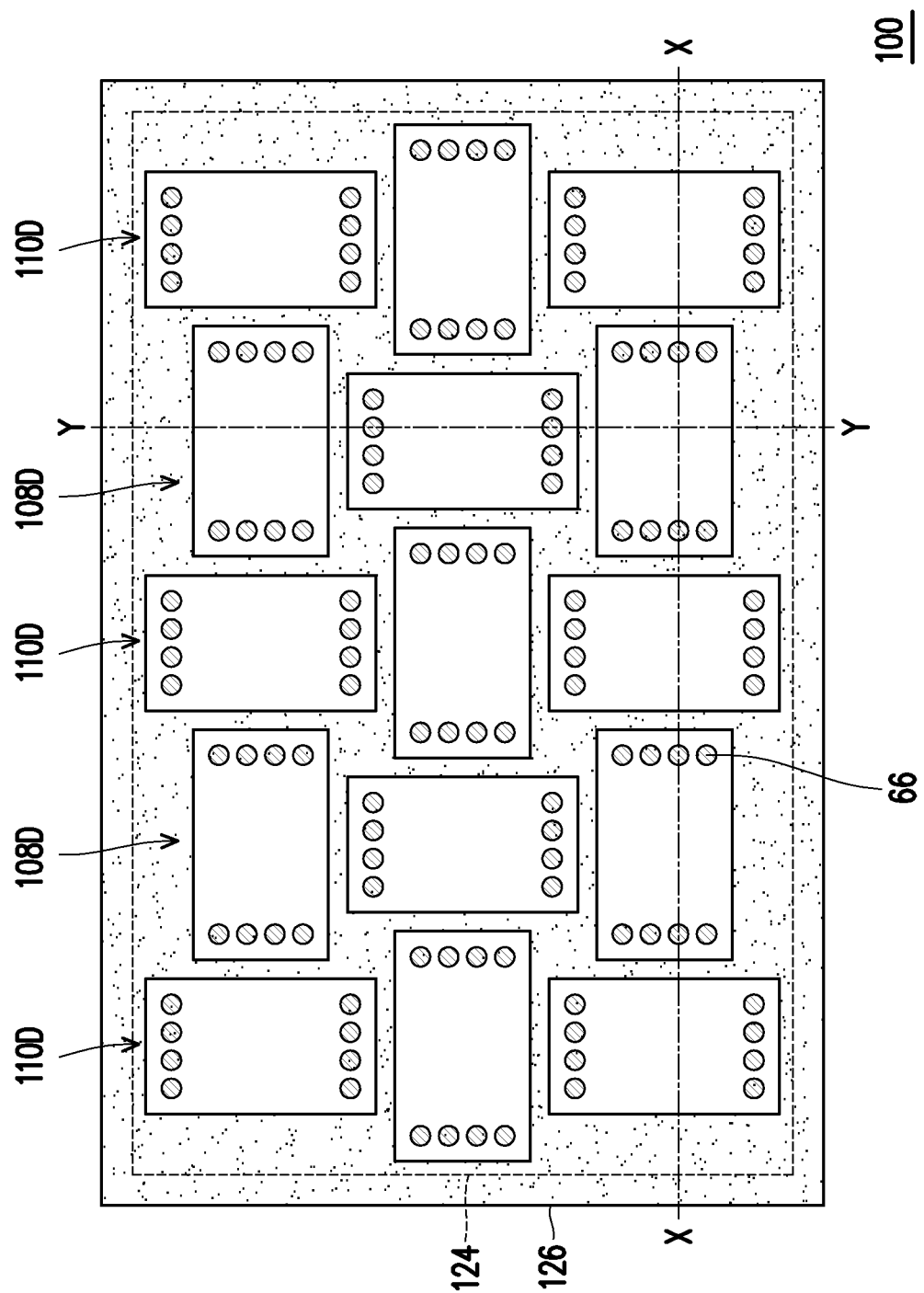
Figure 5B:
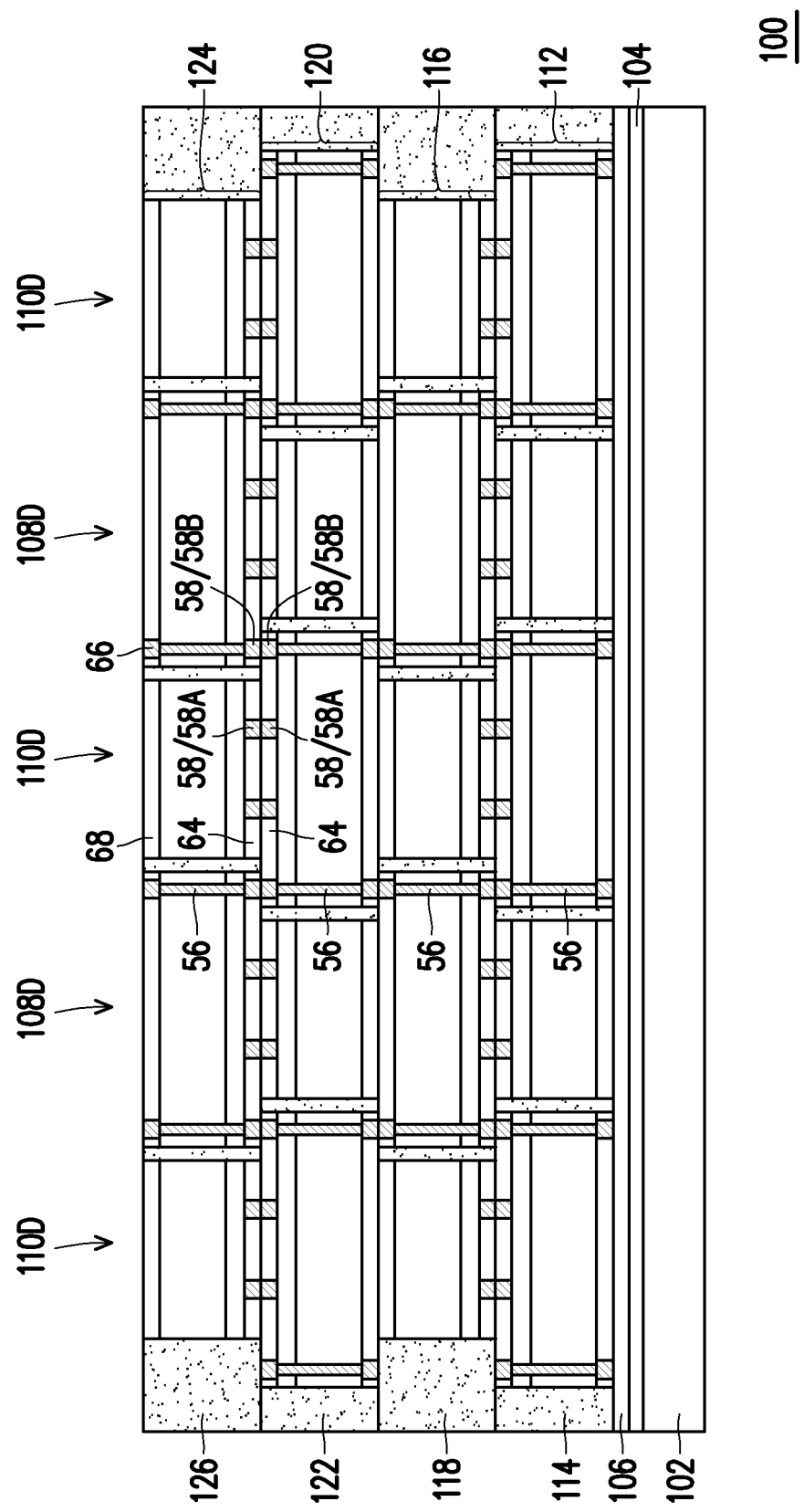
Figure 5C:
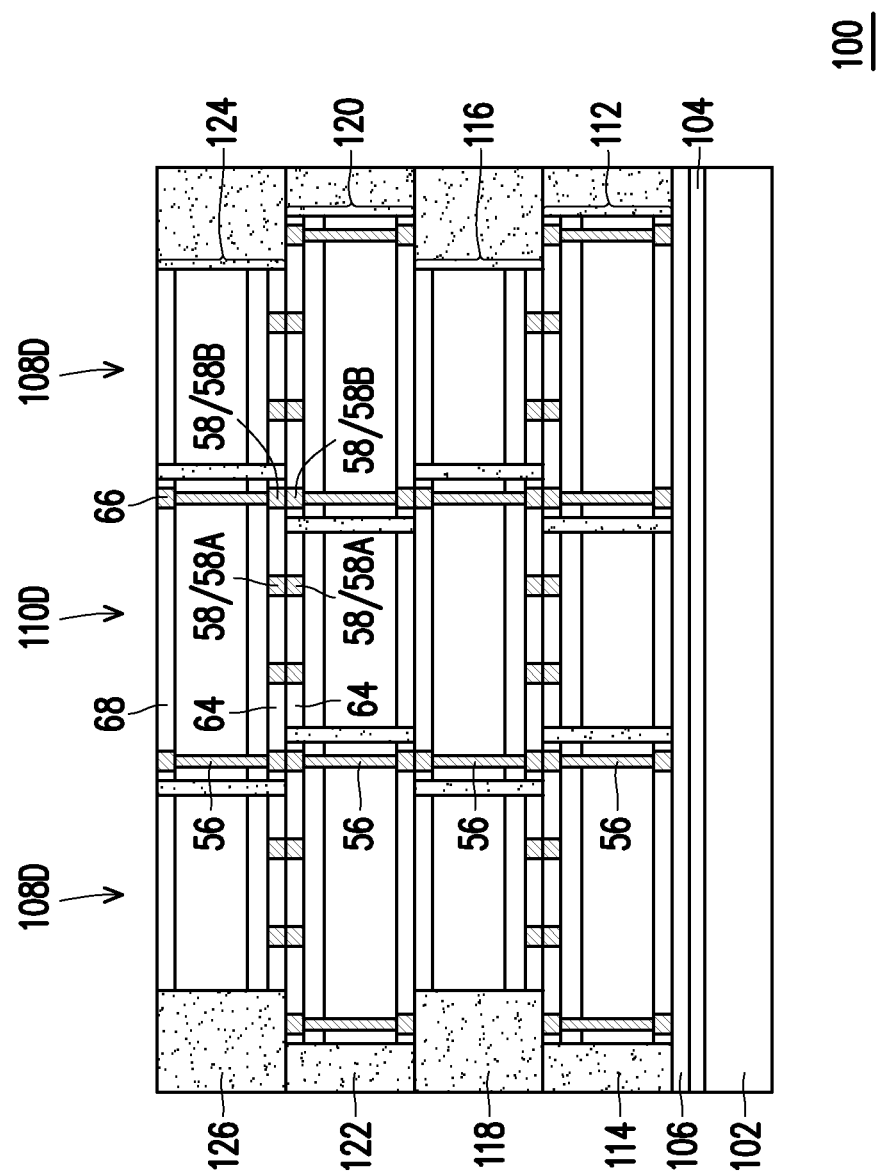

In FIGS. 5A, 5B, and 5C, memory dies 108D and logic dies 110D are bonded to the memory dies 108C and logic dies 110C. The memory dies 108D and logic dies 110D have similar features as the integrated circuit die 50, and similar reference numerals are used to illustrate similar features. The dies are directly bonded in a face-to-face manner by hybrid bonding, where the dielectric layer 64 of one die is bonded to the dielectric layer 64 of another die through dielectric-to-dielectric bonding, and where the die connectors 58 of one die are bonded to the die connectors 58 of another die through metal-to-metal bonding, without using any eutectic material (e.g., solder). The hybrid bonding may be performed using a similar method as that described above with respect to FIGS. 3A, 3B, and 3C.

The memory dies 108D and logic dies 110D are placed face-down in a die array 124, on the die array 120. The memory dies 108D and logic dies 110D are placed in a checkerboard die orientation pattern in the top-down view of the die array 124. In other words, orientations of the memory dies 108D and logic dies 110D alternate along the rows and columns of the die array 124, where the longitudinal axes of the memory dies 108D are parallel and extend in a first direction, and the longitudinal axes of the logic dies 110D are parallel and extend in a second direction, with the first and second directions being perpendicular, and the first and second directions each being parallel to a major surface of the dielectric layer 106. The longitudinal axes of the memory dies 108D are parallel to the longitudinal axes of the memory dies 108A, 108B, and 108C (see FIGS. 2A, 3A, and 4A), and the longitudinal axes of the logic dies 110D are parallel to the longitudinal axes of the logic dies 110A, 110B, and 110C (see FIGS. 2A, 3A, and 4A). Further, the memory dies 108D and logic dies 110D are alternatingly disposed along the rows and columns of the die array 124.

The memory dies 108D are centered over the logic dies 110C, and the die connectors 58A of each memory die 108D are bonded to the die connectors 58A of a corresponding logic die 110C, such that bonded pairs of the memory dies 108D and logic dies 110C are electrically connected to one another. Likewise, the logic dies 110D are centered over the memory dies 108C, and the die connectors 58A of each logic die 110D are bonded to the die connectors 58A of a corresponding memory die 108C, such that bonded pairs of the memory dies 108C and logic dies 110D are electrically connected to one another. Each bonded die pair forms a computing site, with each memory die acting as a local, high-bandwidth, low-latency cache for its corresponding logic die. The die connectors 58B of each memory die 108D are bonded to the die connectors 58B of adjacent memory dies 108C (see FIG. 5B), such that the memory dies 108C and 108D are electrically connected to one another. The memory dies 108B and 108D are thus electrically connected to one another by the through vias 56 of the memory dies 108C. Each memory die 108D partially overlaps and is bonded to one underlying logic die 110C and two underlying memory dies 108C. Likewise, the die connectors 58B of each logic die 110D are bonded to the die connectors 58B of adjacent logic dies 110C (see FIG. 5C), such that the logic dies 110C and 110D are electrically connected to one another. The logic dies 110B and 110D are thus electrically connected to one another by the through vias 56 of the logic dies 110C. Each logic die 110D partially overlaps and is bonded to one underlying memory die 108C and two underlying logic dies 110C.

A dielectric layer 126 is then formed surrounding the memory dies 108D and logic dies 110D. The dielectric layer 126 can be formed after placement of the memory dies 108D and logic dies 110D but before annealing to complete the hybrid bonding, or can be formed after annealing. The dielectric layer 126 fills gaps between respective ones of the memory dies 108D and logic dies 110D, thus protecting the dies. The dielectric layer 126 may be an oxide such as silicon oxide, PSG, BSG, BPSG, or the like; a nitride such as silicon nitride or the like; a polymer such as PBO, polyimide, BCB, or the like; an encapsulant such as a molding compound, epoxy, or the like; the like, or a combination thereof. In some embodiments, the dielectric layer 126 is an oxide such as silicon oxide. A planarization process may be performed on the dielectric layer 126 to expose the die connectors 66 of the memory dies 108D and logic dies 110D. The planarization process may also be performed on the dielectric layers 68. Top surfaces of the die connectors 66, dielectric layers 68, and dielectric layer 126 are planar after the planarization process. The planarization process may be, for example, a CMP process, a grinding process, an etch back process, the like, or combinations thereof.

Because the memory dies 108D and logic dies 110D do not concentrically overlap the memory dies 108C and logic dies 110C, some portions of the dielectric layers 122 and 126 can participate in the hybrid bonding. For example, the memory dies 108D and logic dies 110D can also be bonded to portions of the dielectric layer 122. Likewise, the memory dies 108C and logic dies 110C can also be bonded to portions of the dielectric layer 126.

After the memory dies 108D and logic dies 110D are bonded to the memory dies 108C and logic dies 110C, circuit probe (CP) testing is performed to ascertain whether the memory dies 108C and 108D and the logic dies 110C and 110D are known good dies (KGDs). The integrated circuit dies are tested by use of a probe. The probe is physically and electrically connected to the die connectors 66 by, e.g., test connectors. The CP testing can also be used to ascertain whether the memory dies 108D and logic dies 110D have been fully bonded to the memory dies 108C and logic dies 110C. The hybrid bonds may be reworked (e.g., by performing additional annealing) if the intermediate structure fails the CP testing. The testing may include testing of the functionality of the various integrated circuit dies, or may include testing for known open or short circuits that may be expected based on the design of the integrated circuit dies. After testing is complete, the probe is removed and any excess reflowable material on the die connectors 66 may be removed by, e.g., an etching process, a chemical-mechanical polish (CMP), a grinding process, or the like.

Figure 6A:
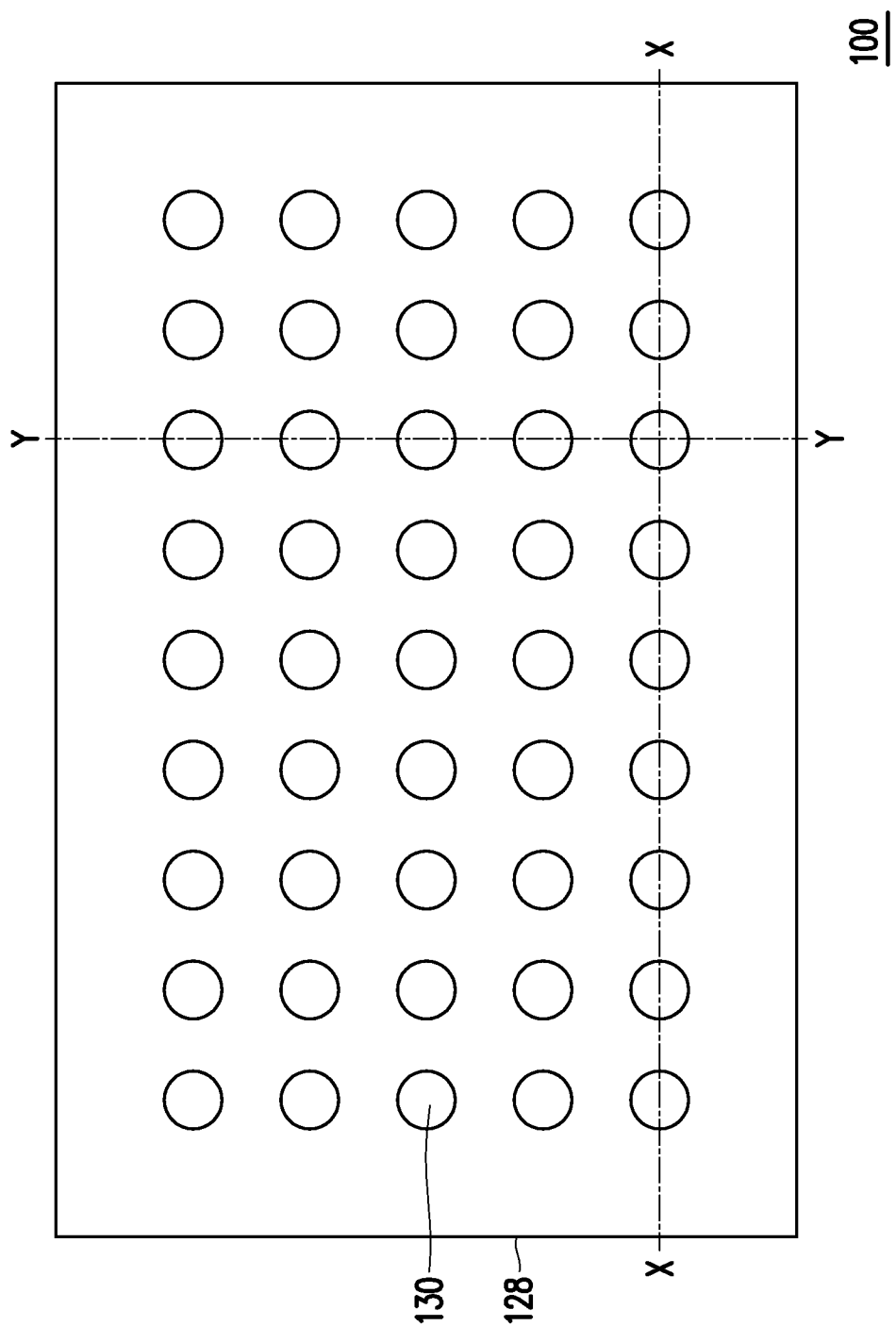
Figure 6B:
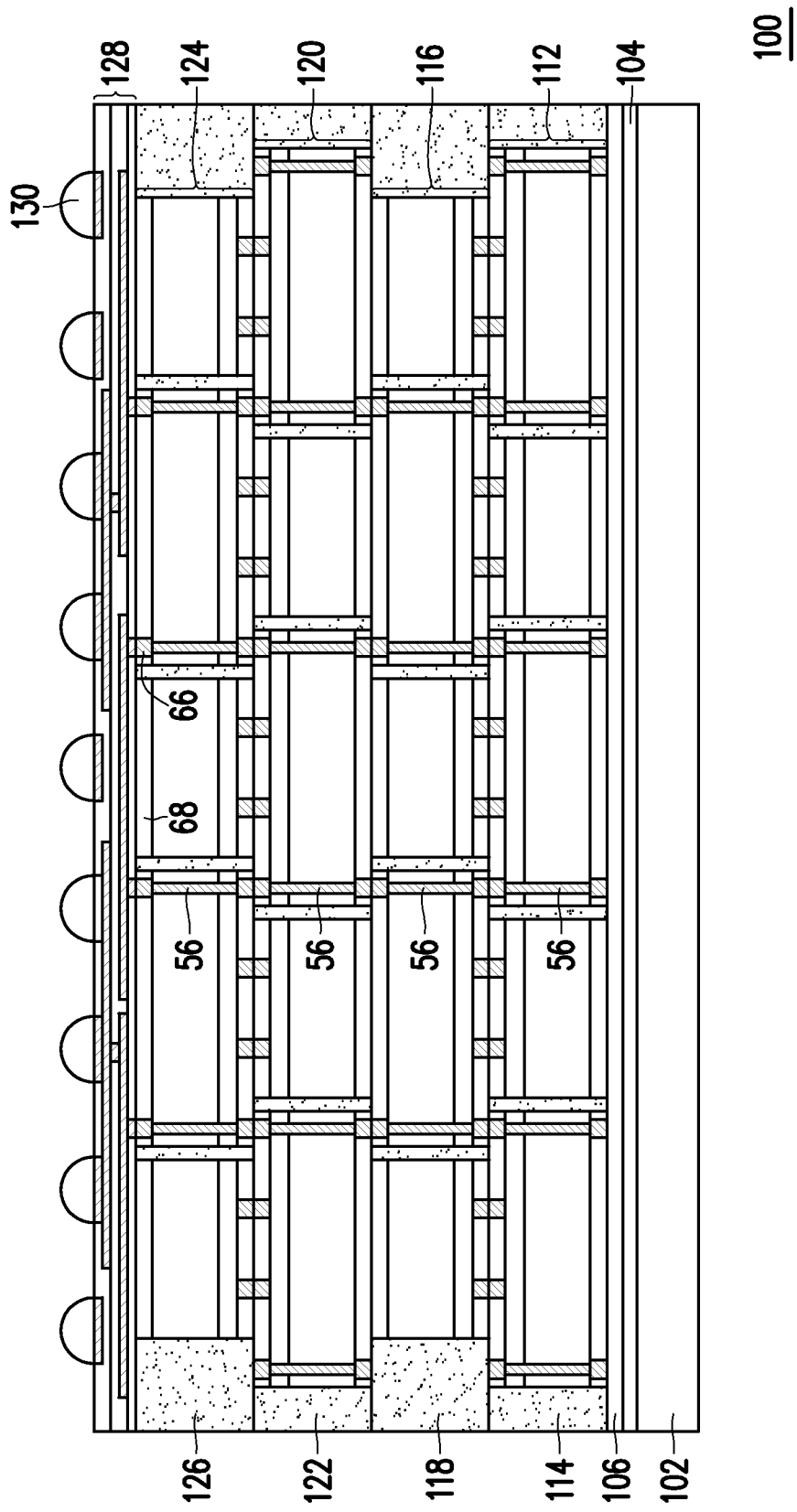
Figure 6C:
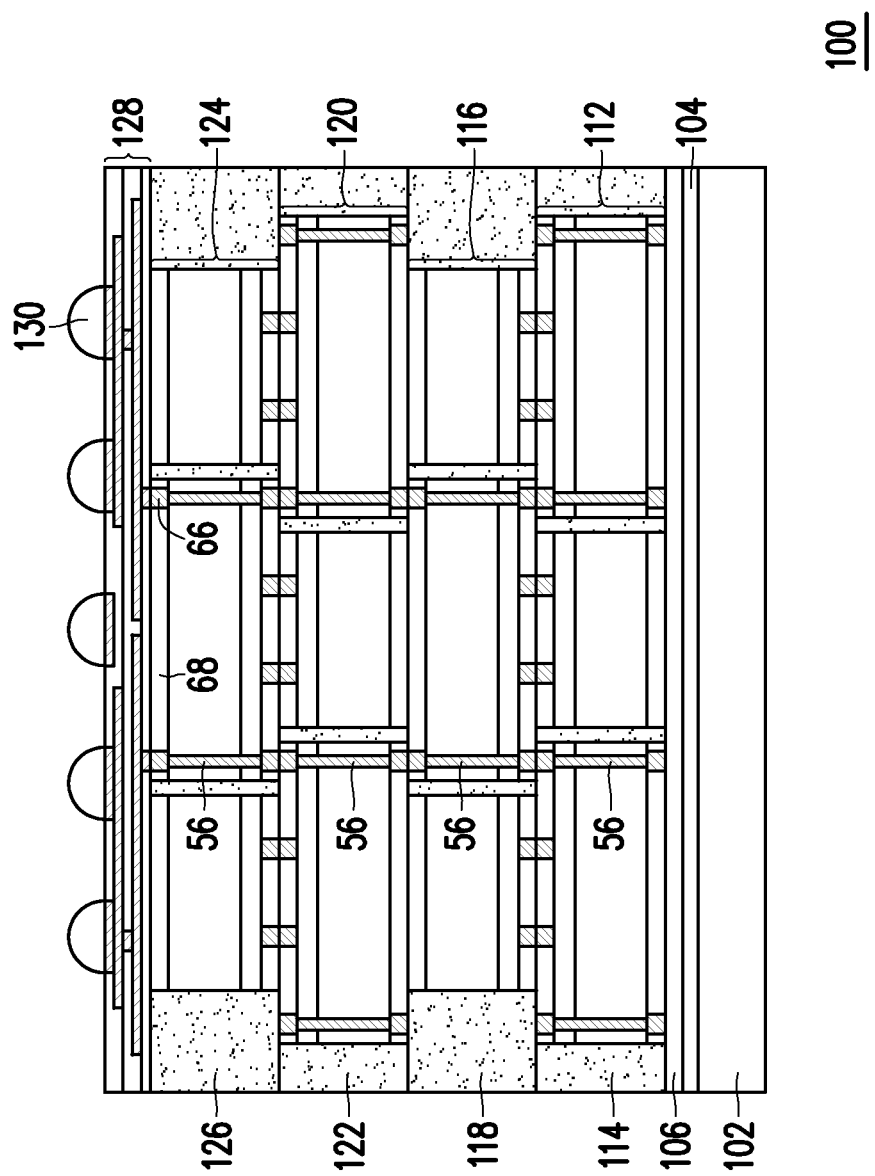

In FIGS. 6A, 6B, and 6C, a redistribution structure 128 is formed on the dielectric layer 126, memory dies 108D, and logic dies 110D, such as on the die connectors 66 and dielectric layers 68. The redistribution structure 128 includes multiple dielectric layers, metallization patterns, and vias. For example, the redistribution structure 128 may be patterned as a plurality of discrete metallization patterns separated from each other by respective dielectric layers. In some embodiments, the dielectric layers are formed of a polymer, which may be a photo-sensitive material such as PBO, polyimide, BCB, or the like, may be patterned using a lithography mask. In other embodiments, the dielectric layers are formed of a nitride such as silicon nitride; an oxide such as silicon oxide, PSG, BSG, BPSG; or the like. The dielectric layers may be formed by spin coating, lamination, CVD, the like, or a combination thereof. After formation, the dielectric layers are patterned to expose underlying conductive features. For example, the bottom dielectric layer is patterned to expose portions of the die connectors 66, and intermediate dielectric layer(s) are patterned to expose portions of underlying metallization patterns. The patterning may be by an acceptable process, such as by exposing the dielectrics layers to light when the dielectric layers are a photo-sensitive material, or by etching using, for example, an anisotropic etch. If the dielectric layers are photo-sensitive materials, the dielectric layers can be developed after the exposure.

Metallization patterns are formed extending along and through each dielectric layer. A seed layer (not shown) is formed over each respective dielectric layer and in the openings through the respective dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photo resist is then formed and patterned on the seed layer. The photo resist may be formed by spin coating or the like and may be exposed to light for patterning. The pattern of the photo resist corresponds to the metallization pattern. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern for one layer of the redistribution structure 128.

The redistribution structure 128 is shown as an example. More or fewer dielectric layers and metallization patterns than shown may be formed in the redistribution structure 128. One having ordinary skill in the art will readily understand which steps and processes would be omitted or repeated to form more or fewer dielectric layers and metallization patterns.

Further, conductive connectors 130 are formed physically and electrically connected to the redistribution structure 128. The top dielectric layer of the redistribution structure 128 may be patterned to expose portions of the underlying metallization patterns. In some embodiments, under bump metallurgies (UBMs) may be formed in the openings. The conductive connectors 130 are formed on the UBMs. The conductive connectors 130 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 130 may be formed of a metal or metal alloy, such as solder, copper, aluminum, gold, nickel, silver, palladium, tin, the like, or a combination thereof. In some embodiments, the conductive connectors 130 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 130 are metal pillars (such as a copper pillar) formed by a sputtering, printing, electro plating, electroless plating, CVD, or the like. The metal pillars may be solder free and have substantially vertical sidewalls. The conductive connectors 130 are electrically connected to the metallization patterns of the redistribution structure 128.

Additional processing may be performed to complete the integrated circuit package 100. For example, a singulation process can be performed by sawing along scribe line regions to singulate the integrated circuit package 100 from adjacent package regions. Further, a carrier substrate de-bonding can be performed to detach (or "de-bond") the carrier substrate 102 from the dielectric layer 106. In accordance with some embodiments, the de-bonding includes projecting a light such as a laser light or an UV light on the release layer 104 so that the release layer 104 decomposes under the heat of the light and the carrier substrate 102 can be removed. The structure can then be flipped over and placed on a tape. Some of the processes discussed herein may be performed after placing the structure on the tape. For example, the conductive connectors 130 may not be formed until after the structure is placed on the tape.

The integrated circuit package 100 is shown as an example. More or fewer die array layers than shown may be formed in the integrated circuit package 100 by omitting or repeating steps described herein to form more or fewer die array layers. Alternating ones of the die array layers are directly bonded in a face-to-face manner or a back-to-back manner. Circuit probe (CP) testing can be performed after each pair of face-to-face die array layers is formed, to ascertain whether the dies have been fully bonded, or whether the hybrid bonds should be reworked (e.g., by performing additional annealing).

Figure 7:
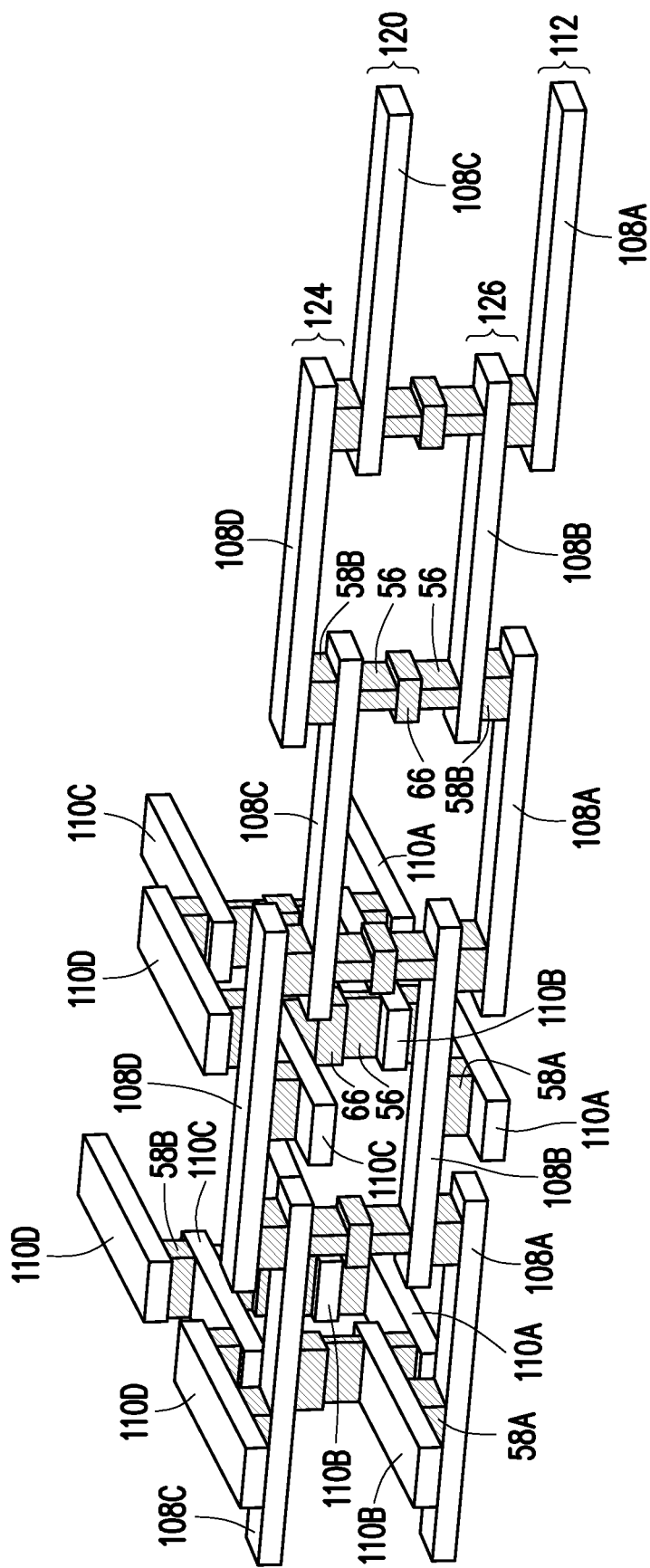
FIG. 7 illustrates the electrical connections between the memory dies and logic dies of an integrated circuit package, in accordance with some embodiments.

FIG. 7 illustrates the electrical connections between the memory dies and logic dies of the integrated circuit package 100, in accordance with some embodiments. FIG. 7 is a block diagram, and omits or simplifies some features of the integrated circuit package 100 for clarity. Because the die arrays 112, 116, 120, and 124 have checkerboard die orientation patterns, the memory dies 108A, 108B, 108C, and 108D along a given column of the integrated circuit package 100 are bonded together to form a memory die network in a plane along that column (e.g., parallel to reference cross-section X-X of FIGS. 2A through 6C). Likewise, the logic dies 110A, 110B, 110C, and 110D along a given row of the integrated circuit package 100 are bonded together to form a logic die network in a plane along that row (e.g., parallel to reference cross-section Y-Y of FIGS. 2A through 6C). The die arrays 112, 116, 120, and 124 are used to form multiple memory die networks in parallel planes, and multiple logic die networks in parallel planes. FIG. 7 illustrates one memory die network and two logic die networks. The die connectors 58B are used for intra-network connection of the various dies within each logic/memory die network. The die connectors 58A are used for inter-network connection of the dies within each logic/memory die network. The integrated circuit package 100 thus comprises a three-dimensional die network of logic and memory dies. The three-dimensional die network comprises a plurality of two-dimensional die networks, e.g., logic die networks and memory die networks. Each logic/memory die network is disposed within one plane of the three-dimensional die network.

Forming a three-dimensional die network from a plurality of two-dimensional die networks allows hybrid bonding to be used to both form and interconnect the two-dimensional die networks, allowing the speed, bandwidth, and latency of memory access to be improved. Computing efficiency of the SoIC device may be improved, particularly for highly parallel workloads, such as artificial intelligence (AI) computations. Further, the dies of the three-dimensional die network may be connected to form many types of computing networks, such as ring networks, mesh networks, torus networks, fat tree networks, and the like. Further, depending on how the die network is formed, some types of known good die (KGD) testing techniques, such as Joint Test Action Group (JTAG) boundary scans, may have improved performance.

Figure 8:
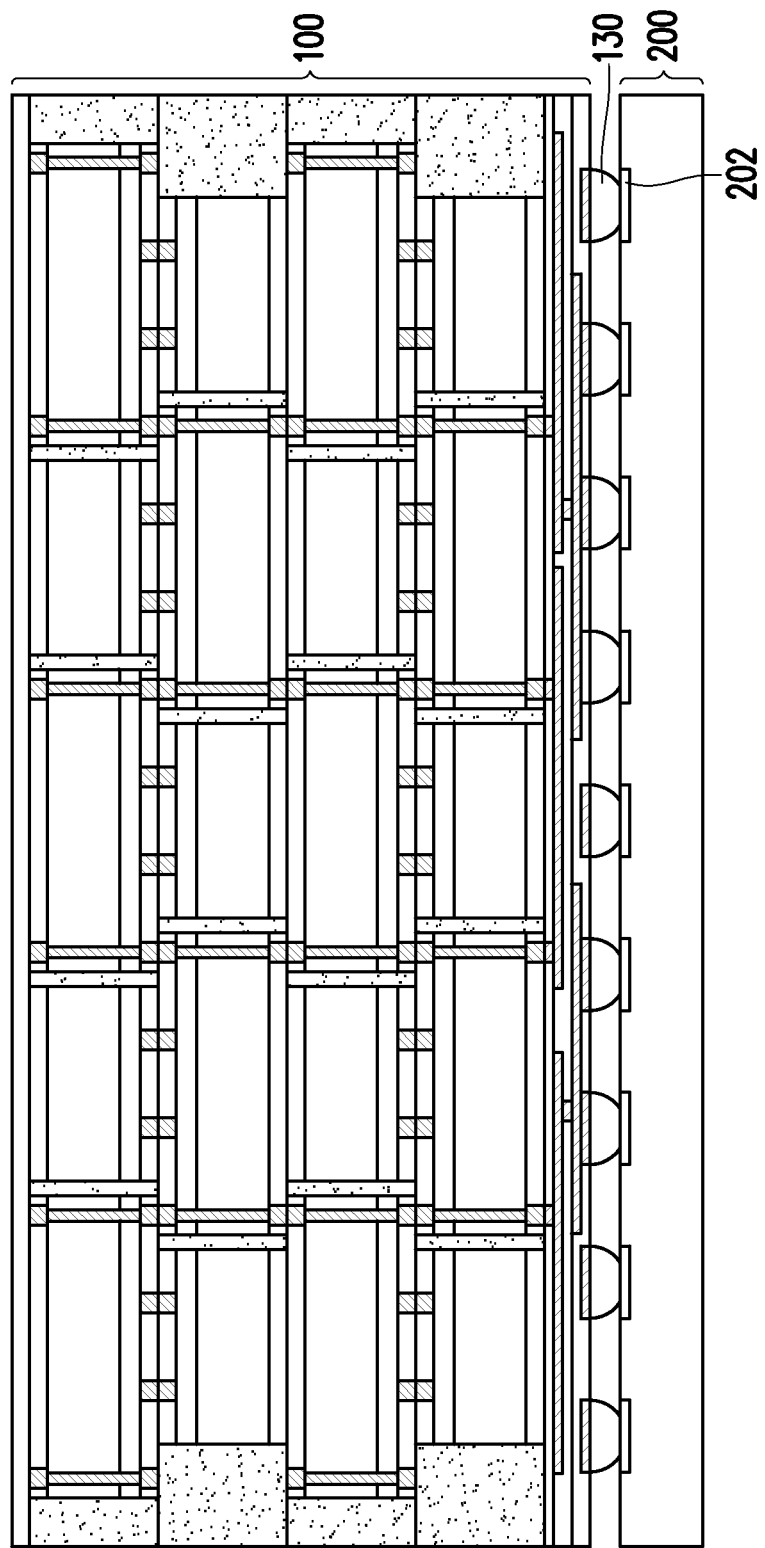
FIG. 8 illustrates a system including an integrated circuit package, in accordance with some embodiments.

FIG. 8 illustrates a system including an integrated circuit package 100, in accordance with some embodiments. FIG. 8 is a cross-sectional view of the integrated circuit package 100 along similar cross-section as the reference cross-section X-X of FIGS. 2A through 6C. In this embodiment, the integrated circuit package 100 is mounted to a package substrate 200 using the conductive connectors 130. The package substrate 200 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 200 may be a SOI substrate. Generally, an SOI substrate includes a layer of a semiconductor material such as epitaxial silicon, germanium, silicon germanium, SOI, SGOI, or combinations thereof. The package substrate 200 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 200.

The package substrate 200 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The package substrate 200 may also include metallization layers and vias (not shown) and bond pads 202 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 200 is substantially free of active and passive devices.

In some embodiments, the conductive connectors 130 are reflowed to attach the integrated circuit package 100 to the bond pads 202. The conductive connectors 130 electrically and/or physically connect the package substrate 200, including metallization layers in the package substrate 200, to the integrated circuit package 100. In some embodiments, passive devices (e.g., surface mount devices (SMDs), not illustrated) may be attached to the integrated circuit package 100 (e.g., bonded to the bond pads 202) prior to mounting on the package substrate 200. In such embodiments, the passive devices may be bonded to a same surface of the integrated circuit package 100 as the conductive connectors 130.

The conductive connectors 130 may have an epoxy flux (not shown) formed thereon before they are reflowed with at least some of the epoxy portion of the epoxy flux remaining after the integrated circuit package 100 is attached to the package substrate 200. This remaining epoxy portion may act as an underfill to reduce stress and protect the joints resulting from the reflowing the conductive connectors 130. In some embodiments, an underfill (not shown) may be formed between the integrated circuit package 100 and the package substrate 200, surrounding the conductive connectors 130. The underfill may be formed by a capillary flow process after the integrated circuit package 100 is attached or may be formed by a suitable deposition method before the integrated circuit package 100 is attached.

Figure 9A:
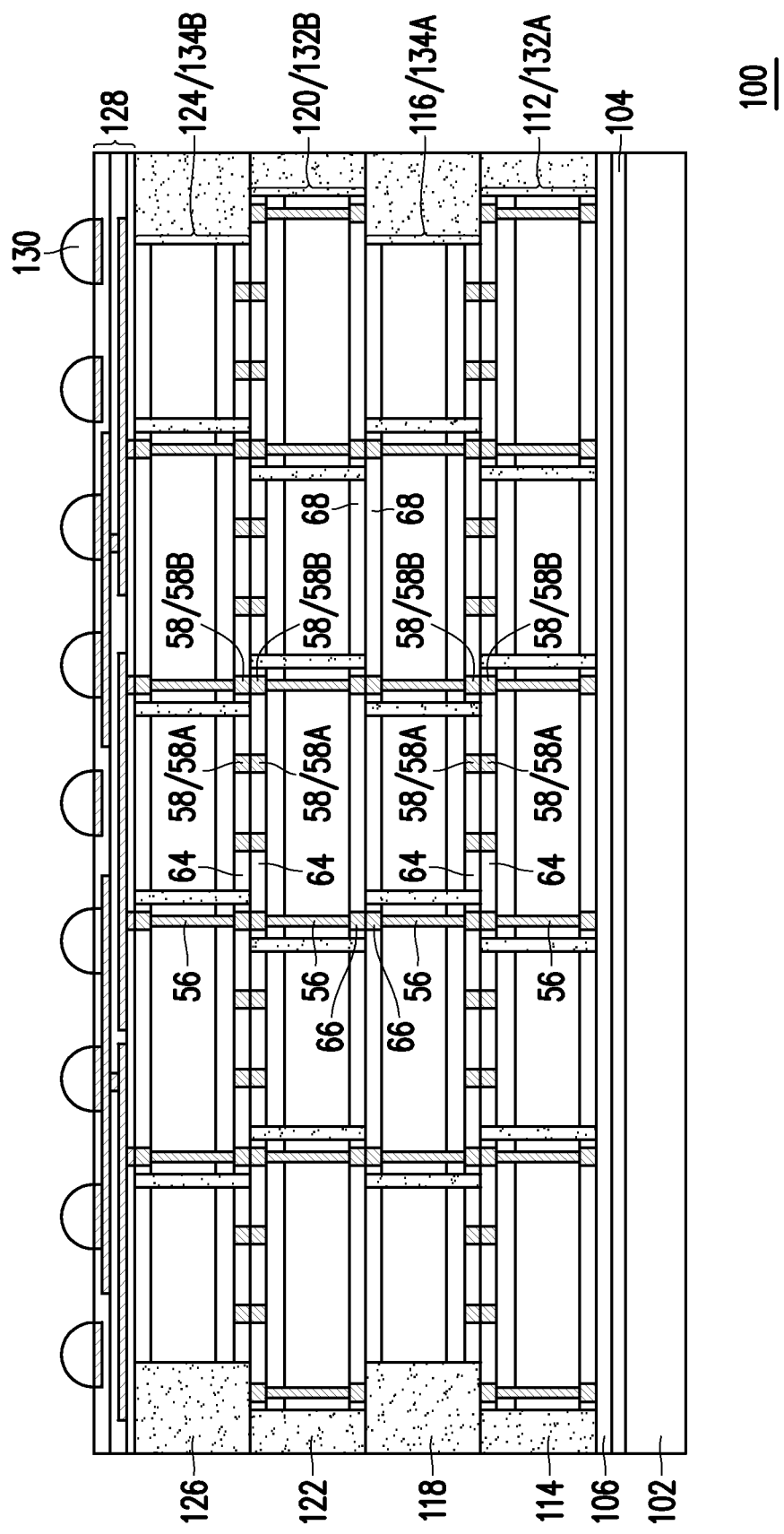
FIGS. 9A and 9B illustrate an intermediate step during a process for forming an integrated circuit package, in accordance with some other embodiments.
Figure 9B:
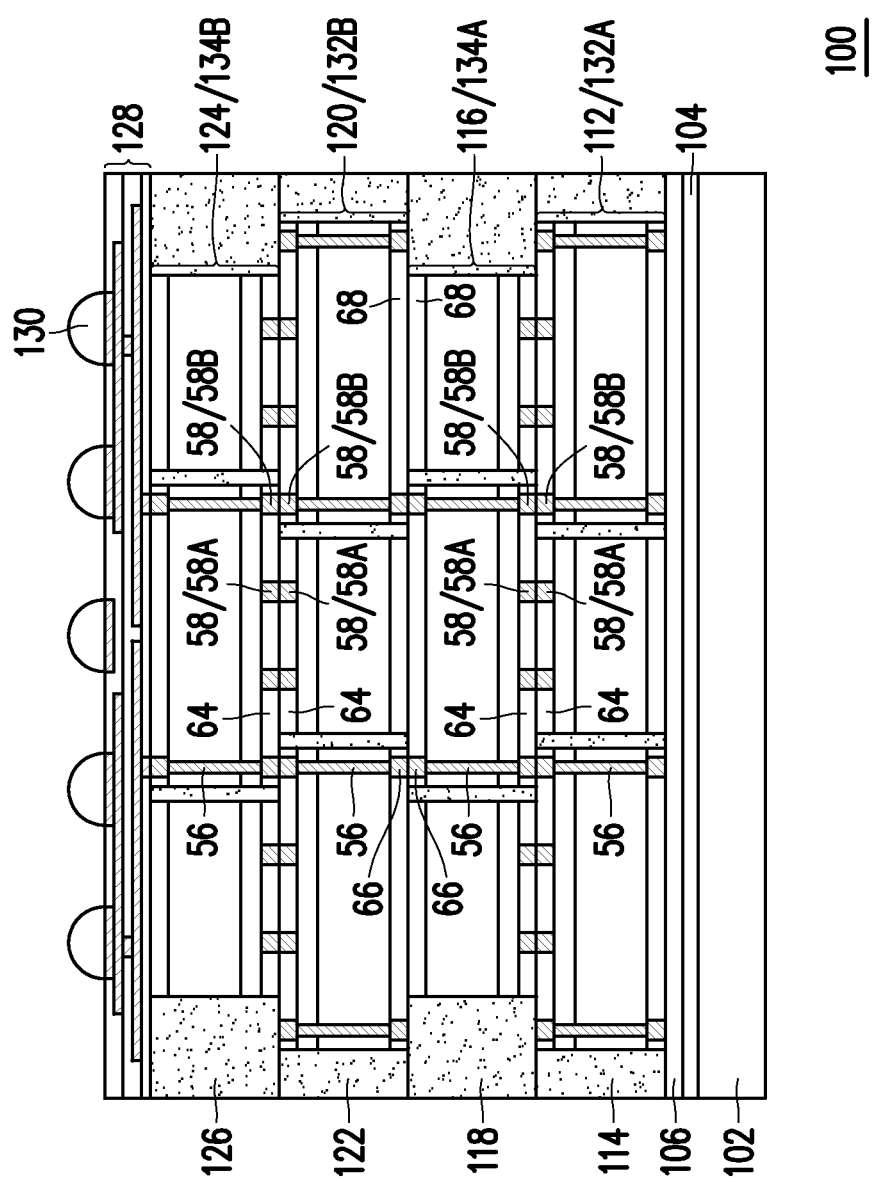
Figure 10A:
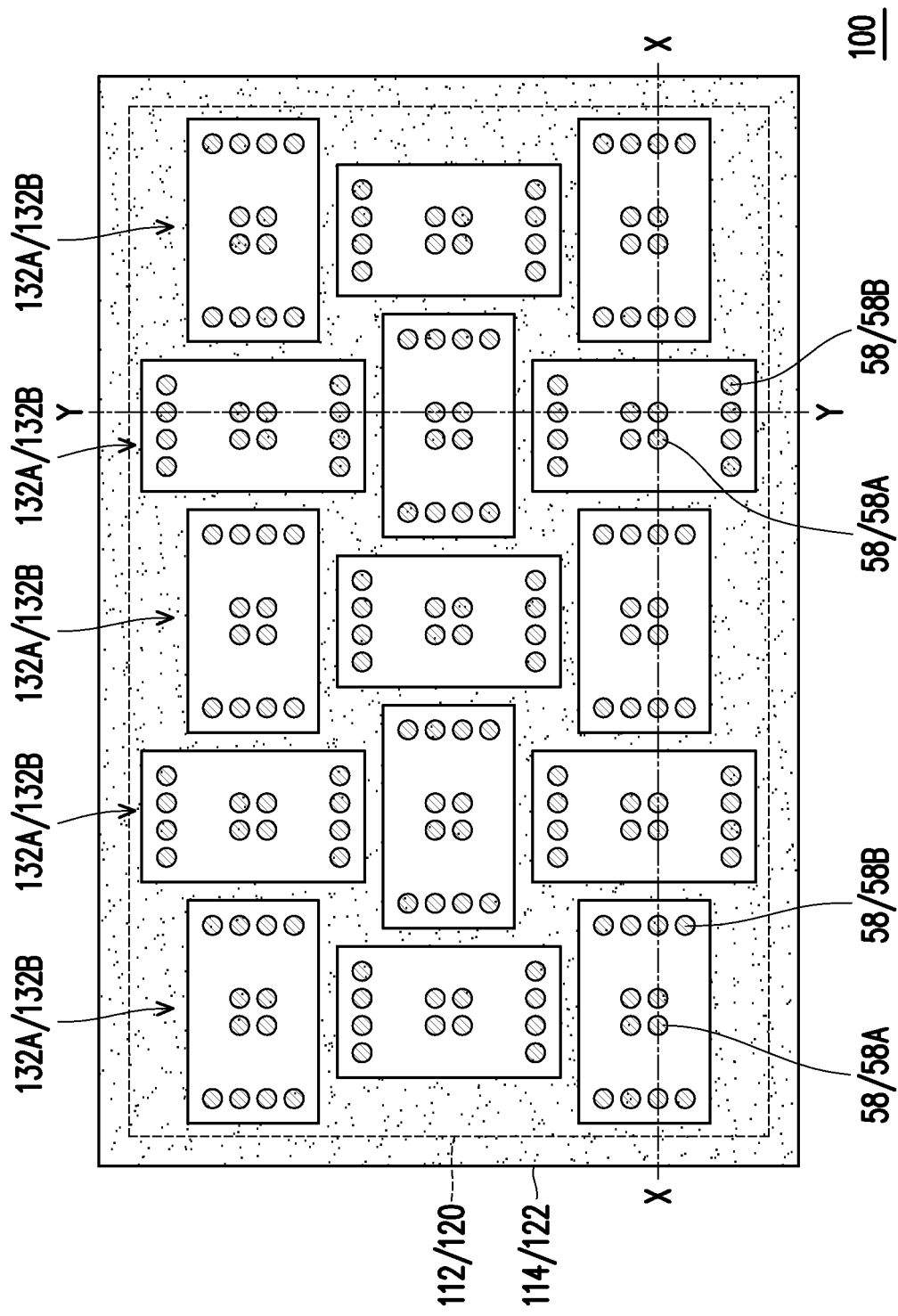
FIGS. 10A and 10B illustrate an integrated circuit package, in accordance with some other embodiments.
Figure 10B:
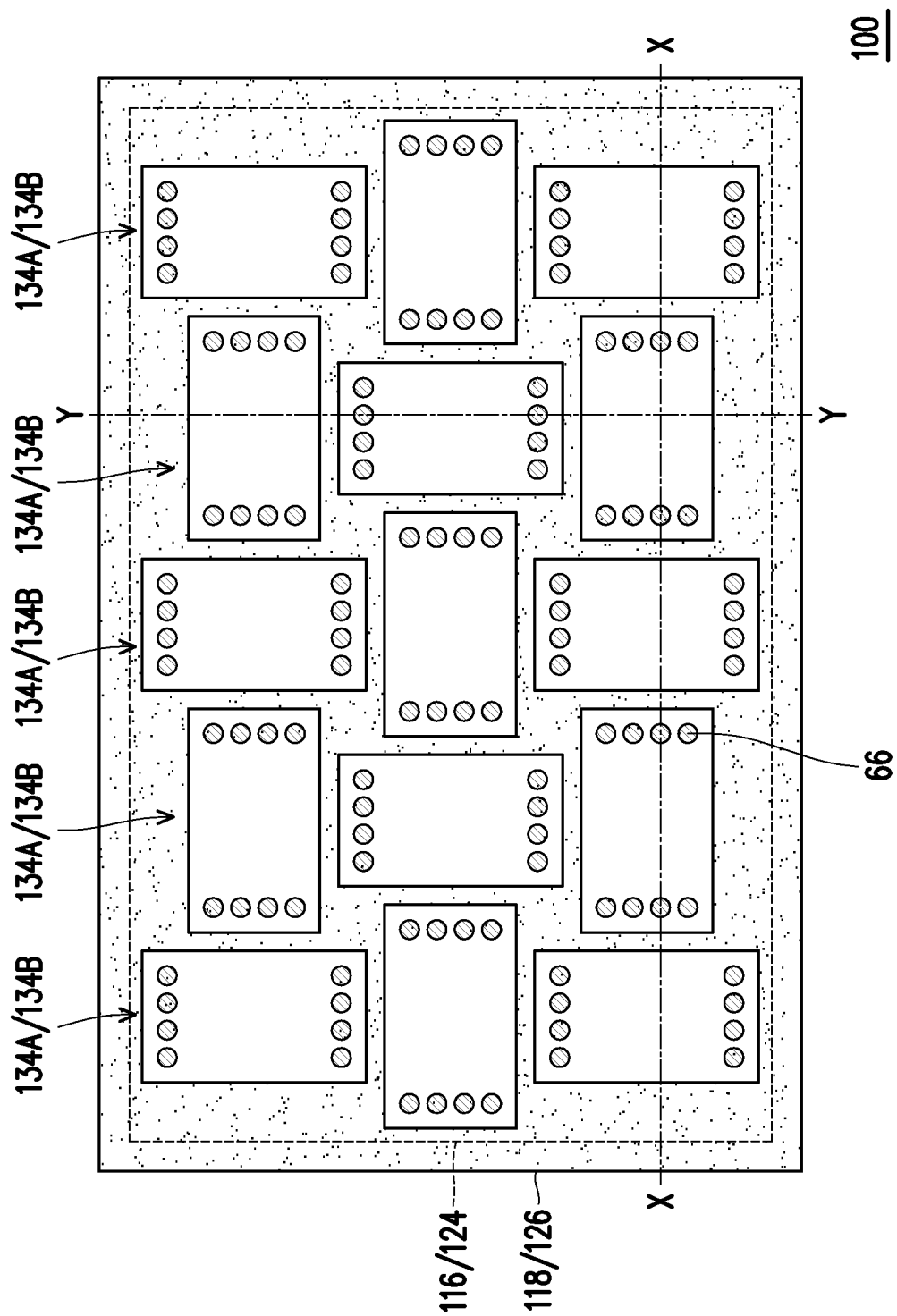

FIGS. 9A and 9B illustrate an intermediate step during a process for forming an integrated circuit package 100, in accordance with some other embodiments. FIG. 9A is a cross-sectional view of the integrated circuit package 100 along similar cross-section as the reference cross-section X-X of FIGS. 2A through 6C. FIG. 9B is a cross-sectional view of the integrated circuit package 100 along similar cross-section as the reference cross-section Y-Y of FIGS. 2A through 6C. In this embodiment, the die arrays 112, 116, 120, and 124 each include one type of die. In particular, the die arrays 112 and 120 include logic dies 132A and 132B, respectively, and the die arrays 116 and 124 include memory dies 134A and 134B, respectively. FIG. 10A is a top-down view of the integrated circuit package 100 after formation of the die arrays 112/120, and FIG. 10B is a top-down view of the integrated circuit package 100 after formation of the die arrays 116/124. The logic dies 132A and 132B and the memory dies 134A and 134B have similar features as the integrated circuit die 50, and similar reference numerals are used to illustrate similar features. The dies of the integrated circuit package 100 are bonded to form a three-dimensional die network. The dies in each of the die arrays 112, 116, 120, and 124 are laid out in a checkerboard die orientation pattern, where the orientations of dies in each die array alternate along the rows and columns of that die array. However, because each of the die arrays 112, 116, 120, and 124 only include one type of die, the types of dies in each die array do not alternate along the rows and columns of that die array.

The logic dies 132A and memory dies 134A are directly bonded in a face-to-face manner by hybrid bonding, where the dielectric layer 64 of one die is bonded to the dielectric layer 64 of another die through dielectric-to-dielectric bonding, and where the die connectors 58 of one die are bonded to the die connectors 58 of another die through metal-to-metal bonding, without using any eutectic material (e.g., solder). Each bonded die pair forms a computing site, with each memory die acting as a local, high-bandwidth, low-latency cache for its corresponding logic die. The memory dies 134A are centered over the logic dies 132A, and the die connectors 58A of each memory die 134A are bonded to the die connectors 58A of a corresponding logic die 132A, such that bonded pairs of logic dies 132A and the memory dies 134A are electrically connected to one another. The die connectors 58B of each memory die 134A are also bonded to the die connectors 58B of adjacent logic dies 132A. Each memory die 134A thus partially overlaps and is bonded to three of the logic dies 132A.

The memory dies 134A and logic dies 132B are directly bonded in a back-to-back manner by hybrid bonding, where the dielectric layer 68 of one die is bonded to the dielectric layer 68 of another die through dielectric-to-dielectric bonding, and where the die connectors 66 of one die are bonded to the die connectors 66 of another die through metal-to-metal bonding, without using any eutectic material (e.g., solder). The logic dies 132B are centered over the memory dies 134A. The die connectors 66 of each logic die 132B are bonded to the die connectors 66 of adjacent memory dies 134A, such that the memory dies 134A and logic dies 132B are electrically connected to one another. The logic dies 132A and 132B are thus electrically connected to one another by the through vias 56 of the memory dies 134A.

Each logic die 132B thus partially overlaps and is bonded to three underlying memory dies 134A.

The logic dies 132B and memory dies 134B are directly bonded in a face-to-face manner by hybrid bonding, where the dielectric layer 64 of one die is bonded to the dielectric layer 64 of another die through dielectric-to-dielectric bonding, and where the die connectors 58 of one die are bonded to the die connectors 58 of another die through metal-to-metal bonding, without using any eutectic material (e.g., solder). Each bonded die pair forms a computing site, with each memory die acting as a local, high-bandwidth, low-latency cache for its corresponding logic die. The memory dies 134B are centered over the logic dies 132B, and the die connectors 58A of each logic die 132B are bonded to the die connectors 58A of a corresponding memory die 134B, such that bonded pairs of the memory dies 134B and logic dies 132B are electrically connected to one another. The die connectors 58B of each memory die 134B are also bonded to the die connectors 58B of adjacent logic dies 132B. The memory dies 134A and 134B are thus electrically connected to one another by the through vias 56 of the logic dies 132B. Each memory die 134B thus partially overlaps and is bonded to three of the logic dies 132B.

Figure 11:
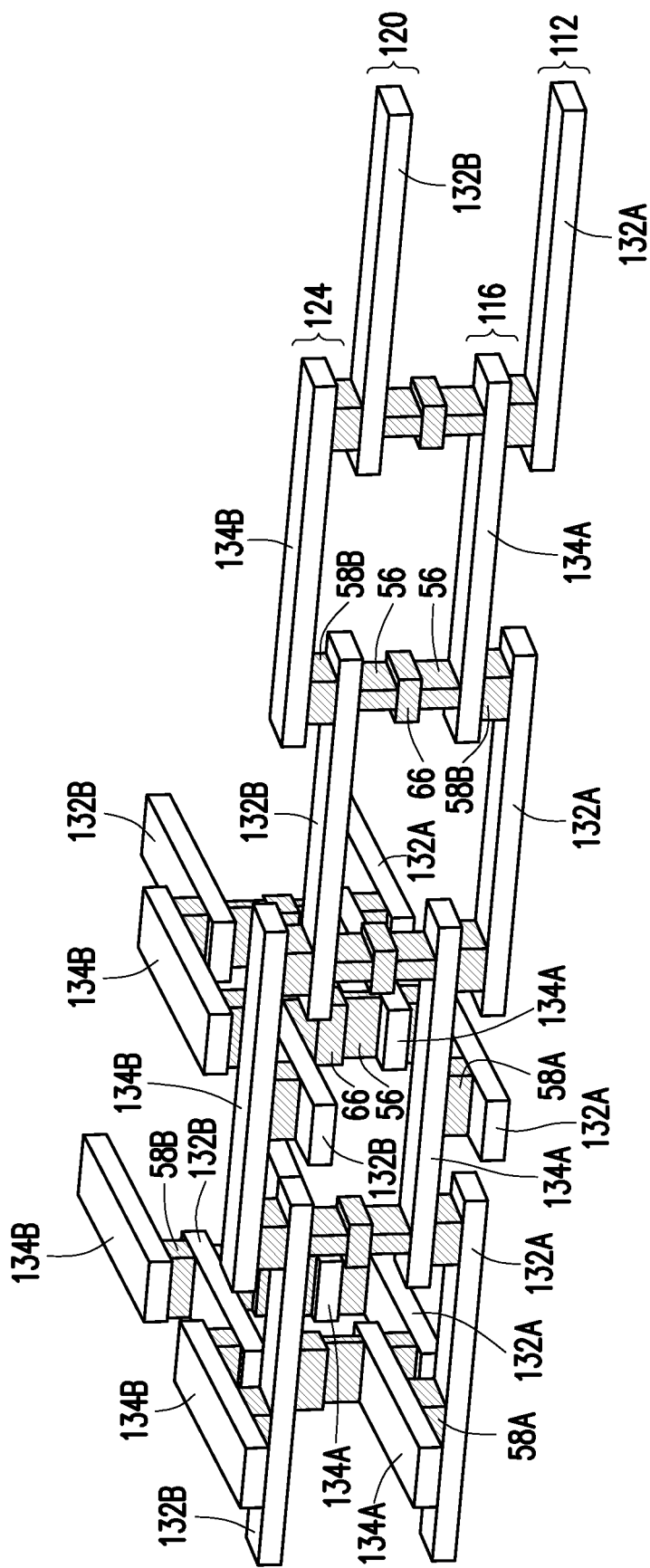
FIG. 11 illustrates the electrical connections between the memory dies and logic dies of an integrated circuit package, in accordance with some other embodiments.

FIG. 11 illustrates the electrical connections between the memory dies and logic dies of the integrated circuit package 100, in accordance with some other embodiments. FIG. 11 is a block diagram, and omits or simplifies some features of the integrated circuit package 100 for clarity. Because the die arrays 112, 116, 120, and 124 have checkerboard die orientation patterns, the logic dies 132A and memory dies 134A are bonded together in a first set of parallel planes (e.g., parallel to reference cross-section X-X of FIGS. 2A through 6C) to form mixed die networks in the first set of parallel planes. Likewise, the logic dies 132B and memory dies 134B are bonded together in a second set of parallel planes (e.g., parallel to reference cross-section Y-Y of FIGS. 2A through 6C) to form mixed die networks in the second set of parallel planes. FIG. 11 illustrates three mixed die networks. The die connectors 58B are used for intra-network connection of the various dies within each mixed die network. The die connectors 58A are used for inter-network connection of the dies within each mixed die network. The integrated circuit package 100 thus comprises a three-dimensional die network of logic and memory dies. The three-dimensional die network comprises a plurality of two-dimensional mixed die networks. Each mixed die network is disposed within one plane of the three-dimensional die network.

Embodiments may achieve advantages. Forming a SoIC device with in-memory computing (IMC) dies instead of traditional logic-only dies may allow for greater calculation speeds in some applications, such as artificial intelligence (AI) computations. Arranging the die arrays in the SoIC device with checkerboard die orientation patterns allows a three-dimensional die network to be built that has logic and memory dies disposed among each other. The speed, bandwidth, and latency of memory access operations may thus be improved. A greater level of chip integration, increased computation performance, and decreased power consumption may thus be achieved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a device includes: a first die array including first integrated circuit dies, orientations of the first integrated circuit dies alternating along rows and columns of the first die array; a first dielectric layer surrounding the first integrated circuit dies, surfaces of the first dielectric layer and the first integrated circuit dies being planar; a second die array including second integrated circuit dies on the first dielectric layer and the first integrated circuit dies, orientations of the second integrated circuit dies alternating along rows and columns of the second die array, front sides of the second integrated circuit dies being bonded to front sides of the first integrated circuit dies by metal-to-metal bonds and by dielectric-to-dielectric bonds; and a second dielectric layer surrounding the second integrated circuit dies, surfaces of the second dielectric layer and the second integrated circuit dies being planar.

In some embodiments of the device, the first integrated circuit dies include first logic dies and first memory dies, the first logic dies and the first memory dies being alternatingly disposed along rows and columns of the first die array, where the second integrated circuit dies include second logic dies and second memory dies, the second logic dies and the second memory dies being alternatingly disposed along rows and columns of the second die array. In some embodiments of the device, longitudinal axes of the first logic dies are parallel and extend in a first direction, where longitudinal axes of the first memory dies are parallel and extend in a second direction, where longitudinal axes of the second logic dies are parallel and extend in the first direction, and where longitudinal axes of the second memory dies are parallel and extend in the second direction, the second direction being perpendicular to the first direction. In some embodiments of the device, each of the second logic dies partially overlaps and is bonded to one of the first memory dies and two of the first logic dies, where each of the second memory dies partially overlaps and is bonded to one of the first logic dies and two of the first memory dies. In some embodiments of the device, the first integrated circuit dies are logic dies, and the second integrated circuit dies are memory dies. In some embodiments of the device, longitudinal axes of the logic dies alternate between being oriented in a first direction and being oriented in a second direction, and longitudinal axes of the memory dies alternate between being oriented in the first direction and being oriented in the second direction, the second direction being perpendicular to the first direction. In some embodiments of the device, each of the memory dies partially overlaps and is bonded to three of the logic dies. In some embodiments of the device, the first integrated circuit dies are bonded to the second dielectric layer by dielectric-to-dielectric bonds, where the second integrated circuit dies are bonded to the first dielectric layer by dielectric-to-dielectric bonds.

In an embodiment, a device includes: a first logic die; a first memory die disposed adjacent to the first logic die; a first dielectric layer surrounding the first logic die and the first memory die, the first dielectric layer having a major surface; a second logic die disposed on the first dielectric layer, the second logic die being directly face-to-face bonded to the first memory die; and a second memory die disposed on the first dielectric layer, the second memory die being directly face-to-face bonded to the first logic die and the first memory die, where longitudinal axes of the first logic die and the second logic die are parallel and extend in a first direction, and longitudinal axes of the first memory die and the second memory die are parallel and extend in a second direction, the first direction and the second direction being perpendicular, the first direction and the second direction each being parallel to the major surface of the first dielectric layer.

In some embodiments of the device, the first logic die and the second logic die are in-memory computing (IMC) dies. In some embodiments of the device, the first memory die and the second memory die are static random access memory (SRAM) dies. In some embodiments, the device further includes: a third logic die disposed adjacent to the first logic die, the third logic die being directly face-to-face bonded to the second logic die; and a fourth logic die disposed on the first dielectric layer, the fourth logic die directly face-to-face bonded to the first logic die. In some embodiments, the device further includes: a third memory die disposed adjacent to the first logic die, the third memory die being directly face-to-face bonded to the fourth logic die; and a fourth memory die disposed on the first dielectric layer, the fourth memory die being directly face-to-face bonded to the third logic die and the third memory die. In some embodiments of the device, the first memory die includes first through substrate vias, and the second memory die includes second through substrate vias, the first through substrate vias being electrically connected to the second through substrate vias. In some embodiments of the device, the first memory die further includes first die connectors, where the second memory die further includes second die connectors, where the first logic die includes third die connectors, and where the second logic die includes fourth die connectors, the first die connectors physically contacting the fourth die connectors, the second die connectors physically contacting the third die connectors.

In an embodiment, a method includes: placing first integrated circuit dies over a carrier substrate in a first checkerboard pattern, the first integrated circuit dies including first die connectors facing away from the carrier substrate after the placing, orientations of the first integrated circuit dies alternating along rows and columns of the first checkerboard pattern; bonding second integrated circuit dies to the first integrated circuit dies, the second integrated circuit dies including second die connectors in physical contact with the first die connectors after the bonding; and forming a redistribution structure over the second integrated circuit dies, the redistribution structure being electrically connected to the second integrated circuit dies and the first integrated circuit dies.

In some embodiments, the method further includes: forming a second dielectric layer around the first integrated circuit dies, the second integrated circuit dies being further bonded to the second dielectric layer by dielectric-to-dielectric bonds after the bonding; and forming a third dielectric layer around the second integrated circuit dies, the first integrated circuit dies being further bonded to the third dielectric layer by dielectric-to-dielectric bonds after the bonding. In some embodiments of the method, the first integrated circuit dies include first memory dies and first logic dies, where the second integrated circuit dies include second memory dies and second logic dies, and further including: placing the second memory dies centered over the first logic dies; and placing the second logic dies centered over the first memory dies. In some embodiments of the method, the first integrated circuit dies are memory dies, and the second integrated circuit dies are logic dies, where the method further includes: placing respective ones of the logic dies over respective ones of the memory dies. In some embodiments, the method further includes: bonding third integrated circuit dies to the second integrated circuit dies, the third integrated circuit dies including third die connectors facing away from the carrier substrate after the bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first die array comprising first integrated circuit dies, orientations of the first integrated circuit dies alternating along rows and columns of the first die array;
   a first dielectric layer surrounding the first integrated circuit dies, surfaces of the first dielectric layer and the first integrated circuit dies being planar;
   a second die array comprising second integrated circuit dies on the first dielectric layer and the first integrated circuit dies, orientations of the second integrated circuit dies alternating along rows and columns of the second die array, front sides of the second integrated circuit dies being bonded to front sides of the first integrated circuit dies by metal-to-metal bonds and by dielectric-to-dielectric bonds; and
   a second dielectric layer surrounding the second integrated circuit dies, surfaces of the second dielectric layer and the second integrated circuit dies being planar.

2. The device of claim 1, wherein the first integrated circuit dies comprise first logic dies and first memory dies, the first logic dies and the first memory dies being alternatingly disposed along rows and columns of the first die array, and wherein the second integrated circuit dies comprise second logic dies and second memory dies, the second logic dies and the second memory dies being alternatingly disposed along rows and columns of the second die array.

3. The device of claim 2, wherein longitudinal axes of the first logic dies are parallel and extend in a first direction, wherein longitudinal axes of the first memory dies are parallel and extend in a second direction, wherein longitudinal axes of the second logic dies are parallel and extend in the first direction, and wherein longitudinal axes of the second memory dies are parallel and extend in the second direction, the second direction being perpendicular to the first direction.

4. The device of claim 2, wherein each of the second logic dies partially overlaps and is bonded to one of the first memory dies and two of the first logic dies, and wherein each of the second memory dies partially overlaps and is bonded to one of the first logic dies and two of the first memory dies.

5. The device of claim 1, wherein the first integrated circuit dies are logic dies, and wherein the second integrated circuit dies are memory dies.

6. The device of claim 5, wherein longitudinal axes of the logic dies alternate between being oriented in a first direction and being oriented in a second direction, and wherein longitudinal axes of the memory dies alternate between being oriented in the first direction and being oriented in the second direction, the second direction being perpendicular to the first direction.

7. The device of claim 5, wherein each of the memory dies partially overlaps and is bonded to three of the logic dies.

8. The device of claim 1, wherein the first integrated circuit dies are bonded to the second dielectric layer by dielectric-to-dielectric bonds, and wherein the second integrated circuit dies are bonded to the first dielectric layer by dielectric-to-dielectric bonds.

9. A device comprising:
a first logic die;
a first memory die disposed adjacent to the first logic die;
a first dielectric layer surrounding the first logic die and the first memory die, the first dielectric layer having a major surface;
a second logic die disposed on the first dielectric layer, the second logic die being directly face-to-face bonded to the first memory die; and
a second memory die disposed on the first dielectric layer, the second memory die being directly face-to-face bonded to the first logic die and the first memory die, wherein longitudinal axes of the first logic die and the second logic die are parallel and extend in a first direction, and longitudinal axes of the first memory die and the second memory die are parallel and extend in a second direction, the first direction and the second direction being perpendicular, the first direction and the second direction each being parallel to the major surface of the first dielectric layer.

10. The device of claim 9, wherein the first logic die and the second logic die are processor dies.

11. The device of claim 9, wherein the first memory die and the second memory die are volatile or non-volatile dies.

12. The device of claim 9 further comprising:
a third logic die disposed adjacent to the first logic die, the third logic die being directly face-to-face bonded to the second logic die;
a fourth logic die disposed on the first dielectric layer, the fourth logic die directly face-to-face bonded to the first logic die;
a third memory die disposed adjacent to the first logic die, the third memory die being directly face-to-face bonded to the fourth logic die; and
a fourth memory die disposed on the first dielectric layer, the fourth memory die being directly face-to-face bonded to the third logic die and the third memory die.

13. The device of claim 9 further comprising:
a second dielectric layer surrounding the second logic die and the second memory die;
a third logic die disposed on the second dielectric layer, the third logic die being directly back-to-back bonded to the second memory die; and
a third memory die disposed on the second dielectric layer, the third memory die being directly back-to-back bonded to the second logic die and the second memory die.

14. The device of claim 9, wherein the first memory die comprises first through substrate vias and a first metallization pattern, and wherein the second memory die comprises second through substrate vias and a second metallization pattern, the first memory die being electrically connected to the second memory die by the first metallization pattern, the first through substrate vias, the second metallization pattern, and the second through substrate vias, and wherein the first logic die comprises third through substrate vias and a third metallization pattern, and wherein the second logic die comprises fourth through substrate vias and a fourth metallization pattern, the first logic die being electrically connected to the second logic die by the third metallization pattern, the third through substrate vias, the fourth metallization pattern, and the fourth through substrate vias.

15. The device of claim 14, wherein the first memory die further comprises first die connectors, wherein the second memory die further comprises second die connectors, wherein the first logic die comprises third die connectors, and wherein the second logic die comprises fourth die connectors, the first die connectors physically contacting the fourth die connectors, the second die connectors physically contacting the third die connectors.

16. A device comprising:
first integrated circuit dies in a first checkerboard pattern, orientations of the first integrated circuit dies alternating along rows and columns of the first checkerboard pattern, the first integrated circuit dies comprising first die connectors;
second integrated circuit dies bonded to the first integrated circuit dies, the second integrated circuit dies being in a second checkerboard pattern, orientations of the second integrated circuit dies alternating along rows and columns of the second checkerboard pattern, the second integrated circuit dies comprising second die connectors in physical contact with the first die connectors; and
a redistribution structure over the second integrated circuit dies, the redistribution structure being electrically connected to the second integrated circuit dies and the first integrated circuit dies.

17. The device of claim 16 further comprising:
a first dielectric layer around the first integrated circuit dies; and
a second dielectric layer around the second integrated circuit dies.

18. The device of claim 16, wherein the first integrated circuit dies comprise first memory dies and first logic dies, and wherein the second integrated circuit dies comprise second memory dies and second logic dies.

19. The device of claim 16, wherein the first integrated circuit dies are memory dies, and wherein the second integrated circuit dies are logic dies.

20. The device of claim 16, wherein each respective first die of the first integrated circuit dies has a first longitudinal axis extending in a first direction, a respective second die of the second integrated circuit dies overlying the respective first die has a second longitudinal axis extending in a second direction, and the second direction is perpendicular to the first direction.

* * * * *